(12) United States Patent
Yu et al.

(10) Patent No.: US 10,854,551 B2
(45) Date of Patent: Dec. 1, 2020

(54) SEMICONDUCTOR PACKAGE AND METHOD OF FABRICATING THE SAME

(71) Applicant: SAMSUNG ELECTRONICS CO., LTD., Suwon-si (KR)

(72) Inventors: Hae-Jung Yu, Seoul (KR); Kyung Suk Oh, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/161,460

(22) Filed: Oct. 16, 2018

(65) Prior Publication Data

US 2019/0244905 A1 Aug. 8, 2019

(30) Foreign Application Priority Data

Feb. 6, 2018 (KR) .................. 10-2018-0014810

(51) Int. Cl.
*H01L 23/538* (2006.01)
*H01L 21/48* (2006.01)
(Continued)

(52) U.S. Cl.
CPC ........ *H01L 23/5386* (2013.01); *H01L 21/486* (2013.01); *H01L 21/4853* (2013.01); *H01L 21/4857* (2013.01); *H01L 21/6835* (2013.01); *H01L 23/13* (2013.01); *H01L 23/3128* (2013.01); *H01L 23/5383* (2013.01); *H01L 23/5384* (2013.01); *H01L 23/5389* (2013.01); *H01L 24/05* (2013.01); *H01L 24/19* (2013.01); *H01L 24/24* (2013.01); *H01L 24/82* (2013.01); *H01L 25/0652* (2013.01); *H01L 25/50* (2013.01); *H01L 2221/68345* (2013.01); *H01L 2221/68359* (2013.01); *H01L 2224/24137* (2013.01); *H01L 2224/24146* (2013.01); *H01L 2224/82005* (2013.01); *H01L 2225/06517* (2013.01); *H01L 2225/06548* (2013.01);
(Continued)

(58) Field of Classification Search
CPC ............ H01L 23/5386; H01L 23/5383; H01L 23/5389; H01L 21/486; H01L 24/82; H01L 2225/06586; H01L 2225/06548
See application file for complete search history.

(56) References Cited

U.S. PATENT DOCUMENTS 5,640,107 A * 6/1997 Kruse .................. G06F 17/5054
326/38
8,217,511 B2 7/2012 Tracht et al.
(Continued)

*Primary Examiner* — Kyoung Lee
*Assistant Examiner* — Christina A Sylvia
(74) *Attorney, Agent, or Firm* — Lee IP Law, P.C.

(57) ABSTRACT

A semiconductor package includes a redistribution layer having a first surface and a second surface opposite to each other, the redistribution layer including a plurality of first redistribution pads on the first surface, a semiconductor chip on the second surface of the redistribution layer, an active surface of the semiconductor chip facing the redistribution layer, a plurality of conductive structures on the second surface of the redistribution layer, the plurality of conductive structures being spaced apart from the semiconductor chip, and a plurality of external connection terminals on and coupled to the conductive structures, the plurality of first redistribution pads have a pitch smaller than a pitch of the plurality of external connection terminals.

18 Claims, 24 Drawing Sheets

(51) Int. Cl.
*H01L 21/683* (2006.01)
*H01L 23/13* (2006.01)
*H01L 23/31* (2006.01)
*H01L 23/00* (2006.01)
*H01L 25/065* (2006.01)
*H01L 25/00* (2006.01)

(52) U.S. Cl.
CPC ............ *H01L 2225/06572* (2013.01); *H01L 2225/06586* (2013.01); *H01L 2924/1431* (2013.01)

(56) References Cited

U.S. PATENT DOCUMENTS

| | | | |
|---|---|---|---|
| 8,264,080 B2 | 9/2012 | Pagaila | |
| 8,884,422 B2 * | 11/2014 | Goh | H01L 25/16 257/686 |
| 8,975,726 B2 | 3/2015 | Chen et al. | |
| 9,111,949 B2 | 8/2015 | Yu et al. | |
| 9,184,131 B2 | 11/2015 | Kuisma | |
| 9,583,472 B2 | 2/2017 | Chung et al. | |
| 9,589,936 B2 | 3/2017 | Zhai et al. | |
| 9,601,463 B2 | 3/2017 | Yu et al. | |
| 9,633,974 B2 | 4/2017 | Zhai et al. | |
| 9,780,074 B2 | 10/2017 | Kim et al. | |
| 2008/0174008 A1 * | 7/2008 | Yang | G11C 5/063 257/723 |
| 2012/0098123 A1 * | 4/2012 | Yu | H01L 23/49822 257/737 |
| 2013/0113115 A1 * | 5/2013 | Wang | H01L 24/97 257/777 |
| 2014/0185264 A1 * | 7/2014 | Chen | H01L 25/0652 361/814 |
| 2016/0056087 A1 * | 2/2016 | Wu | H01L 23/49833 257/738 |
| 2016/0064309 A1 * | 3/2016 | Su | H01L 23/5389 257/773 |
| 2017/0062294 A1 | 3/2017 | Nasrullah et al. | |
| 2017/0103951 A1 | 4/2017 | Lee et al. | |
| 2019/0131241 A1 * | 5/2019 | Jeng | H01L 23/3114 |

* cited by examiner

SEMICONDUCTOR PACKAGE AND METHOD OF FABRICATING THE SAME

CROSS-REFERENCE TO RELATED APPLICATION

Korean Patent Application No. 10-2018-0014810, filed on Feb. 6, 2018, in the Korean Intellectual Property Office, and entitled: "Semiconductor Package and Method of Fabricating the Same," is incorporated by reference herein in its entirety.

BACKGROUND

1. Field

Embodiments relate to a semiconductor package, and more particularly, to a semiconductor package including a redistribution layer, and a method of fabricating the same.

2. Description of the Related Art

A semiconductor package is provided to implement an integrated circuit chip to qualify for use in electronic products. Typically, a semiconductor package is configured such that a semiconductor chip is mounted on a printed circuit board (PCB) and bonding wires or bumps are used to electrically connect the semiconductor chip to the printed circuit board. With the development of electronic industry, there is a growing interest in standardization and miniaturization of semiconductor packages. In addition, various studies are underway to improve compatibility and increase operating speeds of semiconductor packages.

SUMMARY

According to exemplary embodiments, a semiconductor package may include a redistribution layer having a plurality of first redistribution pads on a first surface of the redistribution layer, a semiconductor chip on a second surface of the redistribution layer, a plurality of conductive structures provided on the second surface of the redistribution layer and spaced apart from the semiconductor chip, and a plurality of external connection terminals on and coupled to the conductive structures. An active surface of the semiconductor chip may face the redistribution layer. The first redistribution pads may have a pitch less than a pitch of the external connection terminals.

According to exemplary embodiments, a semiconductor package may include a redistribution layer having a first surface and a second surface standing opposite to each other, a semiconductor chip on the second surface of the redistribution layer, a plurality of conductive structures on the second surface of the redistribution layer and spaced apart from the semiconductor chip, and a first semiconductor device on a first surface of the semiconductor chip. The semiconductor chip may include a chip pad facing the redistribution layer. The first semiconductor device may include a connection pad facing the redistribution layer.

According to exemplary embodiments, a method of fabricating a semiconductor package may include providing a preliminary package having a semiconductor chip, a plurality of conductive structures, and a molding pattern, a plurality of chip pads the first semiconductor chip being exposed on a surface of the preliminary package, the conductive structures being spaced apart from the semiconductor chip, forming a redistribution layer on the surface of the preliminary package, and forming a plurality of external connection terminals on other surface of the preliminary package, the plurality of external connection terminals coupled to the conductive structures. The redistribution layer may include a redistribution pattern coupled to the chip pads and a plurality of first redistribution pads coupled to the redistribution pattern. The first redistribution pads may have a pitch less than a pitch of the external connection terminals.

According to exemplary embodiments, a method of fabricating a semiconductor package may include forming a redistribution layer having a plurality of first redistribution pads on a first surface of the redistribution layer, mounting a semiconductor chip on a second surface of the redistribution layer and electrically connecting the semiconductor chip to the redistribution layer, forming a plurality of conductive structures on the second surface of the redistribution layer and electrically connecting the conductive structures to the redistribution layer, and forming a plurality of external connection terminals on the conductive structures. The external connection terminals may have a pitch greater than a pitch of the first redistribution pads.

BRIEF DESCRIPTION OF THE DRAWINGS

Features will become apparent to those of skill in the art by describing in detail exemplary embodiments with reference to the attached drawings, in which.

DETAILED DESCRIPTION

Figure 1A:
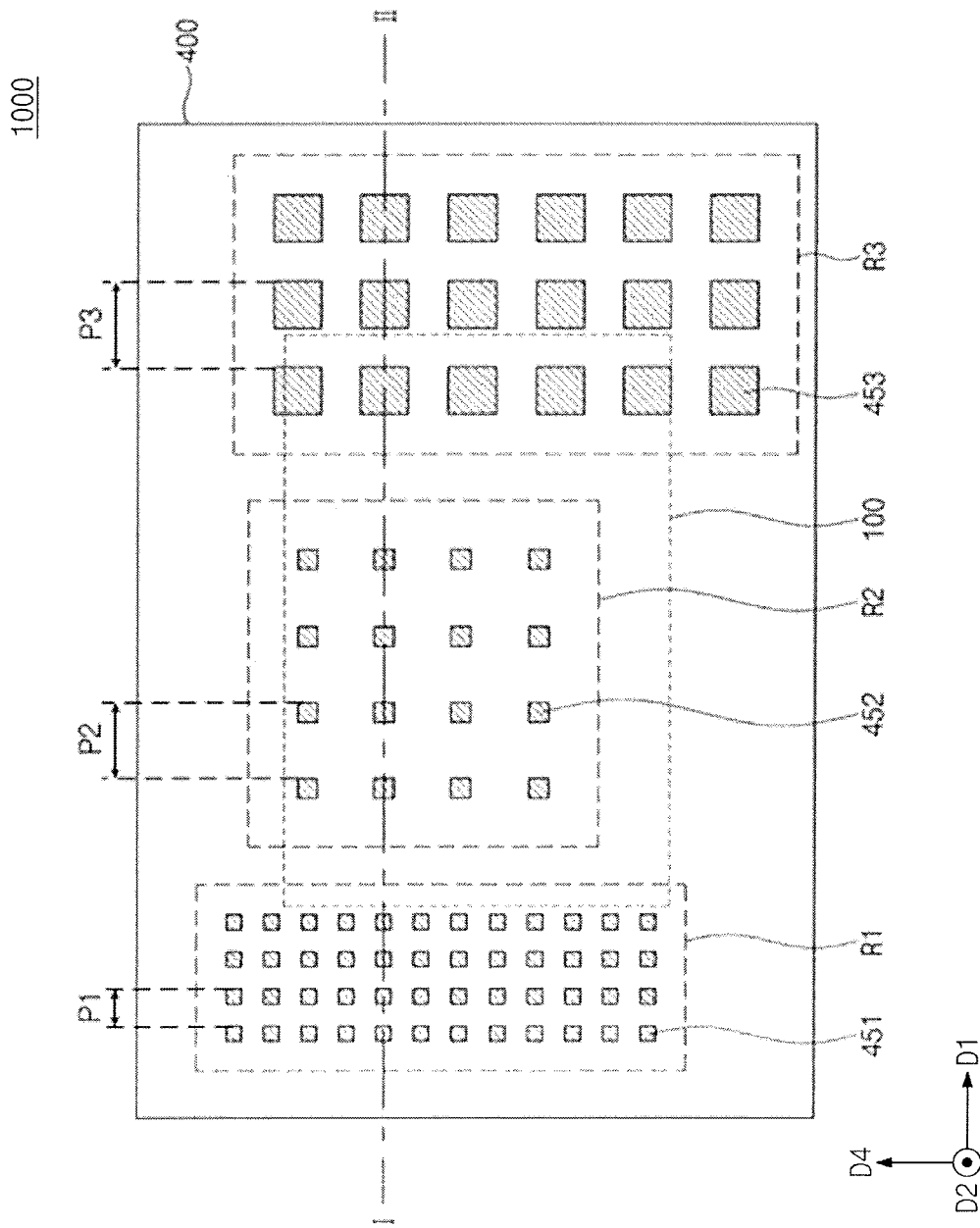
FIG. 1A illustrates a plan view of an interconnect package according to exemplary embodiments.

Like reference numerals indicate like components throughout the description. A semiconductor package and a method of fabricating the same according to exemplary embodiments will be described hereinafter.

Figure 1B:
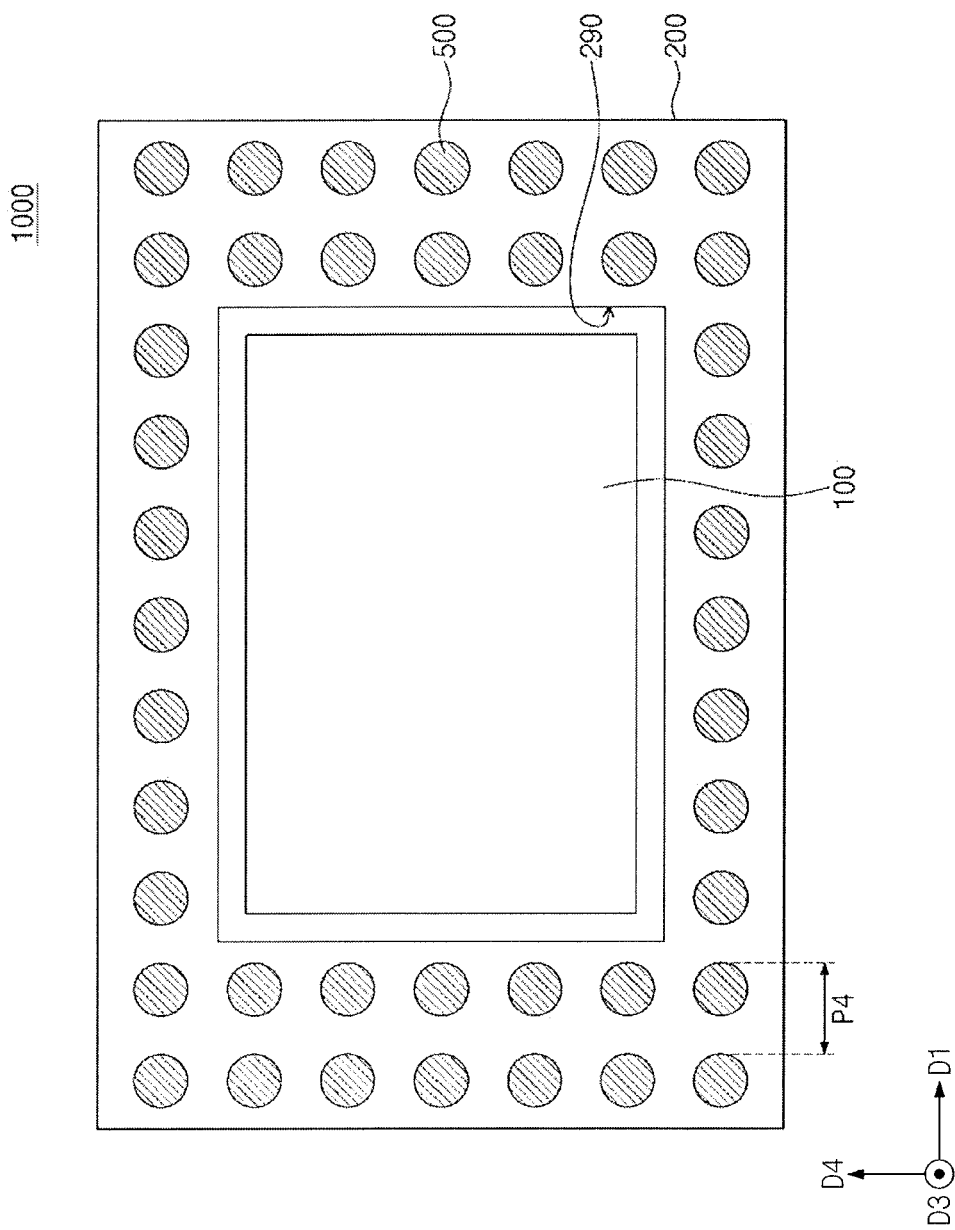
FIG. 1B illustrates a plan view of external connection terminals of a redistribution layer according to exemplary embodiments.

FIG. 1A illustrates a plan view showing an interconnect package according to exemplary embodiments. FIG. 1B illustrates a plan view of external connection terminals of a redistribution layer on a bottom surface of the interconnect package. FIGS. 2A, 2C, 2D, 2E, and 2F illustrate cross-sectional views along line I-II' of FIG. 1A, showing stages in a method of fabricating the interconnect package, with FIG. 2B illustrating an enlarged cross-sectional view showing section III of FIG. 2A. In the following description, for consistency of discussion, FIG. 2E is chosen to define a top surface, an upper portion, a bottom surface, and a lower portion.

Figure 2A:
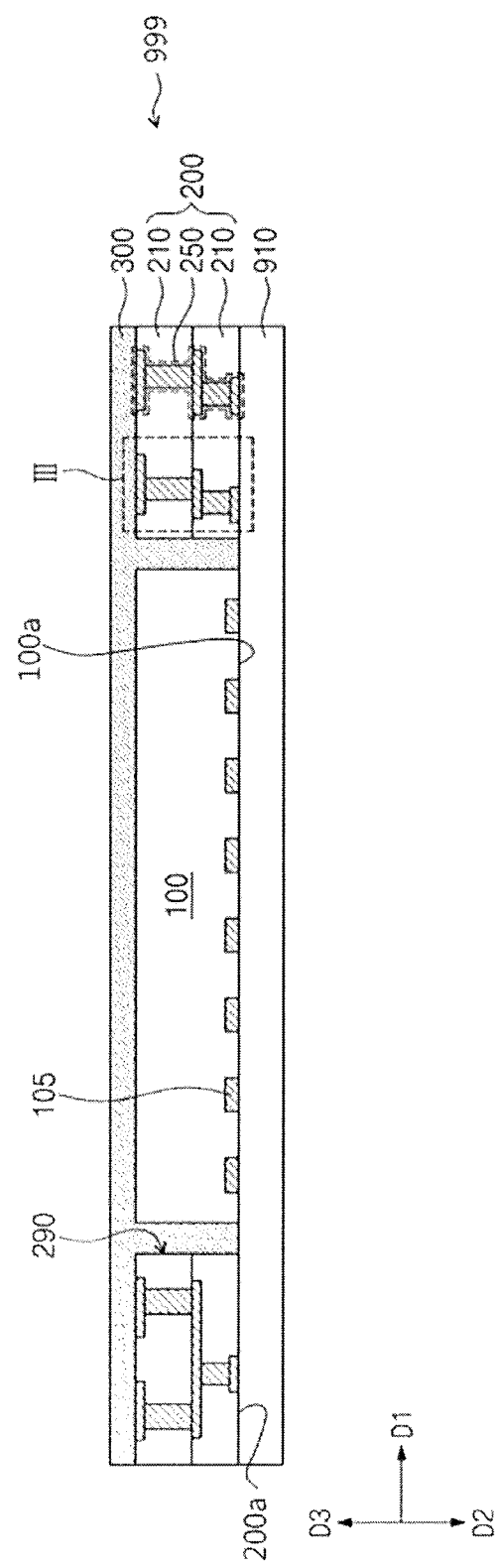
FIGS. 2A, 2C, 2D, 2E, and 2F illustrate cross-sectional views of stages in a method of fabricating an interconnect package according to exemplary embodiments.
Figure 2B:
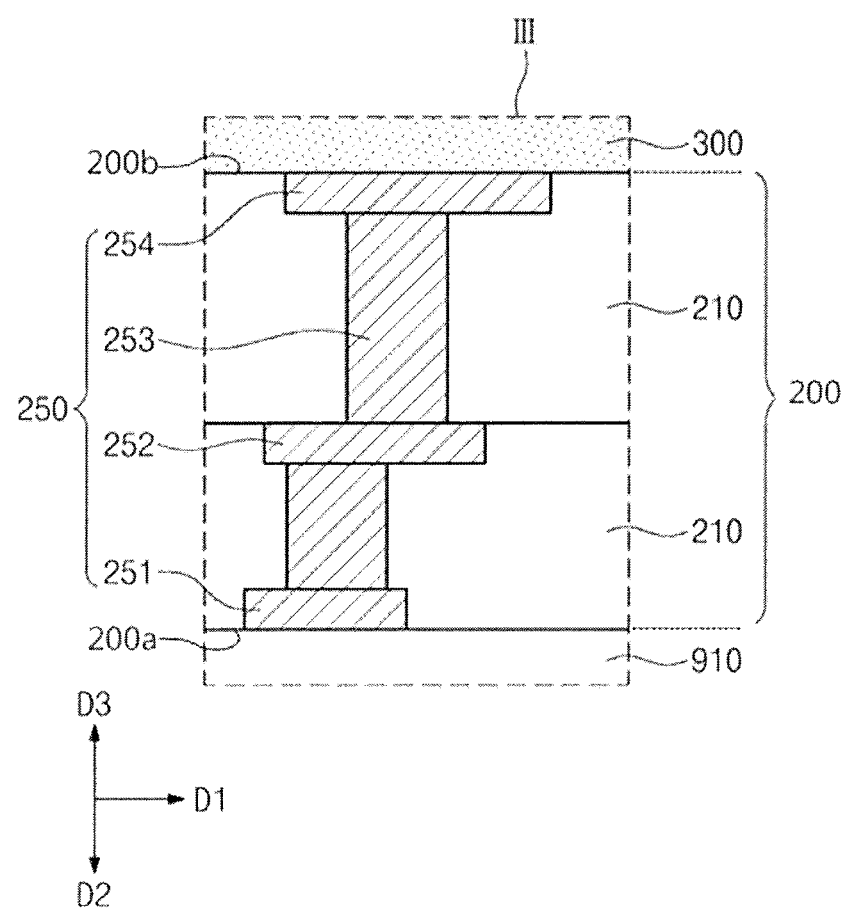
FIG. 2B illustrates an enlarged cross-sectional view of section III of FIG. 2A.

Referring to FIGS. 2A and 2B, a preliminary package 999 may be formed on a first carrier substrate 910. The preliminary package 999 may include a semiconductor chip 100, a wiring substrate 200, and a molding pattern 300. In some embodiments, the first carrier substrate 910 may be prepared. A carrier adhesive layer may further be provided on the first carrier substrate 910.

The wiring substrate 200 may be provided on the first carrier substrate 910. The wiring substrate 200 may have a hole 290 penetrating therethrough. For example, the hole 290 may be formed in a printed circuit board (PCB), and the PCB having the hole 290 may be used as the wiring substrate 200. When viewed in plan view, the hole 290 may be formed on a central portion of the wiring substrate 200. The hole 290 may expose the first carrier substrate 910.

The wiring substrate 200 may include a base layer 210 and conductive structures 250 through the base layer 210. The base layer 210 may include a plurality of stacked base layers 210. The base layers 210 may include a non-conductive material. For example, the base layers 210 may include a ceramic, a silicon-based material, or a polymer. The hole 290 may penetrate through the base layers 210. The conductive structures 250 may be provided in the base layers 210, e.g., in regions of the base layers 210 along a perimeter of the hole 290. For example, as illustrated in FIG. 2A, the wiring substrate 200 may include a plurality of stacked base layers 210 on the first carrier substrate 910, with the hole 290 penetrating through the stacked base layers 210 to expose the first carrier substrate 910, and the conductive structures 250 being in the base layers 210 and peripheral to the hole 290.

As illustrated in FIG. 2B, each of the conductive structures 250 may include a first pad 251, a conductive pattern 252, vias 253, and a second pad 254. The first pad 251 may be provided on a first surface 200a of the wiring substrate 200. The conductive pattern 252 may be interposed between the base layers 210, e.g., one conductive pattern 252 may be interposed between two stacked base layers 210. The vias 253 may penetrate the base layers 210 and may be coupled to the conductive pattern 252. e.g., each via 253 may penetrate one base layer 210 and be coupled to the conductive pattern 252. The second pad 254 may be disposed on a second surface 200b of the wiring substrate 200 and coupled to at least one of the vias 253. The second surface 200b of the wiring substrate 200 may be opposite to the surface 200a of the wiring substrate 200. The second pad 254 may be electrically connected to the first pad 251 through the vias 253 and the conductive pattern 252. The second pad 254 and the first pad 251 may not be aligned with each other along a second direction D2, e.g., the second pad 254 and the first pad 251 may be horizontally offset from each other along a first direction D1. The second pad 254 and the first pad 251 may be different in number, pitch, and/or arrangement.

In this description, the first direction D1 refers to a direction parallel to a surface 100a of the semiconductor chip 100 (FIG. 2A), and the second and third directions D2 and D3 refer to directions perpendicular to the surface 100a of the semiconductor chip 100. The third direction D3 is opposite to the second direction D2.

As illustrated in FIG. 2A, the semiconductor chip 100 may be provided on the first carrier substrate 910. The semiconductor chip 100 may be provided in the hole 290 of the wiring substrate 200, e.g., to be surrounded by the base layers 210 with the conductive structures 250. The surface 100a of the semiconductor chip 100 may be an active surface.

The semiconductor chip 100 may have chip pads 105 on the surface 100a thereof. The chip pads 105 may include metal, e.g., aluminum or copper. The semiconductor chip 100 may be disposed on the first carrier substrate 910 in such a way that the chip pads 105 may face, e.g., and contact, the first carrier substrate 910. The semiconductor chip 100 may be a programmable chip. The semiconductor chip 100 may include integrated circuits therein. e.g., the integrated circuit may include logic circuits. For example, the semiconductor chip 100 may include a field-programmable gate array (FPGA) or an application processor. The semiconductor chip 100 may be provided on the first carrier substrate 910 before or after the wiring substrate 200 is disposed.

The molding pattern 300 may be formed on the semiconductor chip 100 and the wiring substrate 200. The molding pattern 300 may fill a gap between the semiconductor chip 100 and the wiring substrate 200. The molding pattern 300 may include an insulating polymer, e.g., an epoxy-based polymer. For example, the molding pattern 300 may include an adhesive insulation film, e.g., Ajinomoto build-up film (ABF)®. An adhesive insulation film may be attached onto the wiring substrate 200 and the semiconductor chip 100 to form the molding pattern 300.

Figure 2C:
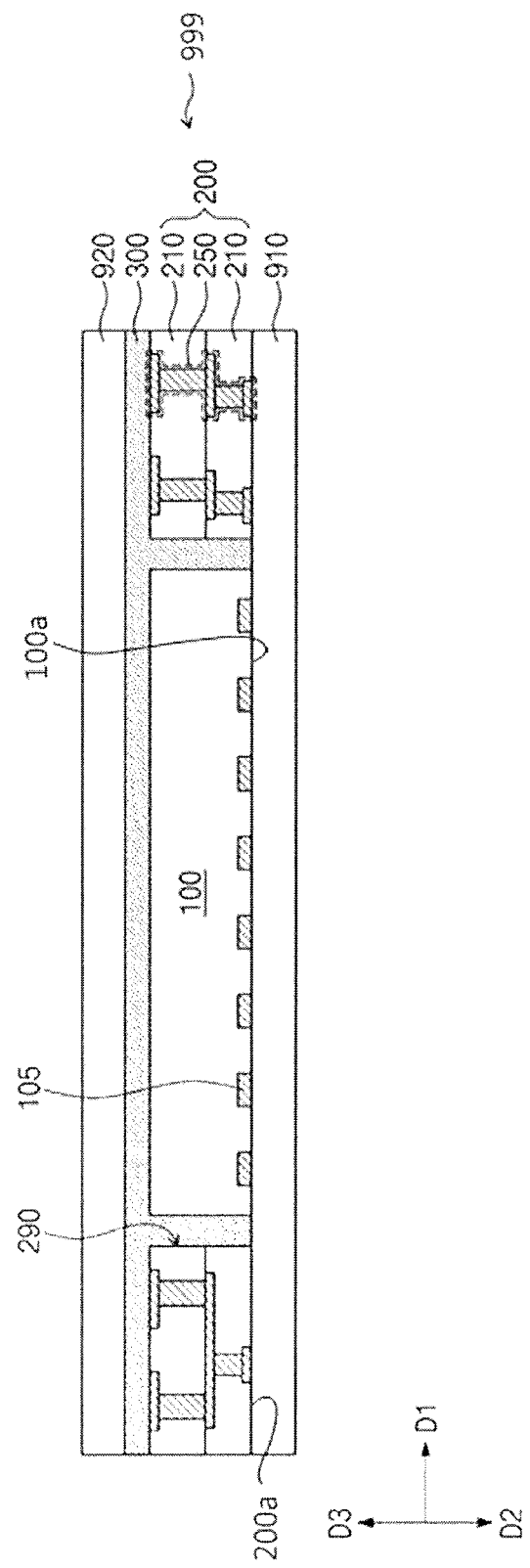

Referring to FIG. 2C, a second carrier substrate 920 may be provided on the molding pattern 300. For example, a removable metal foil may be used as the second carrier substrate 920.

Figure 2D:
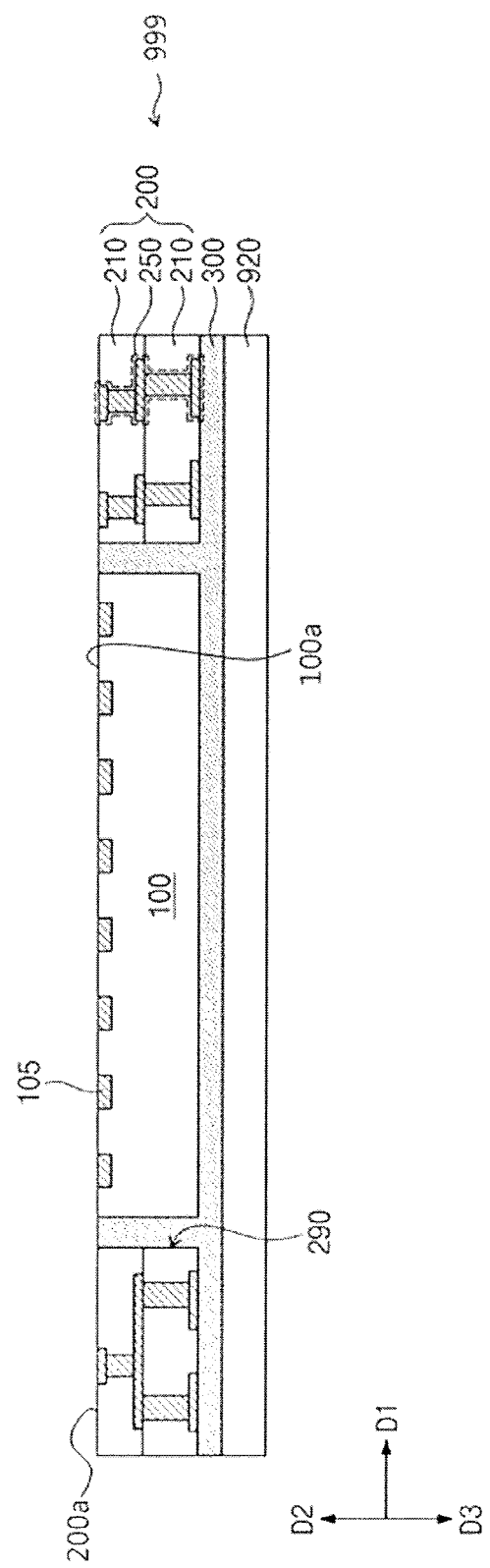
Figure 2E:
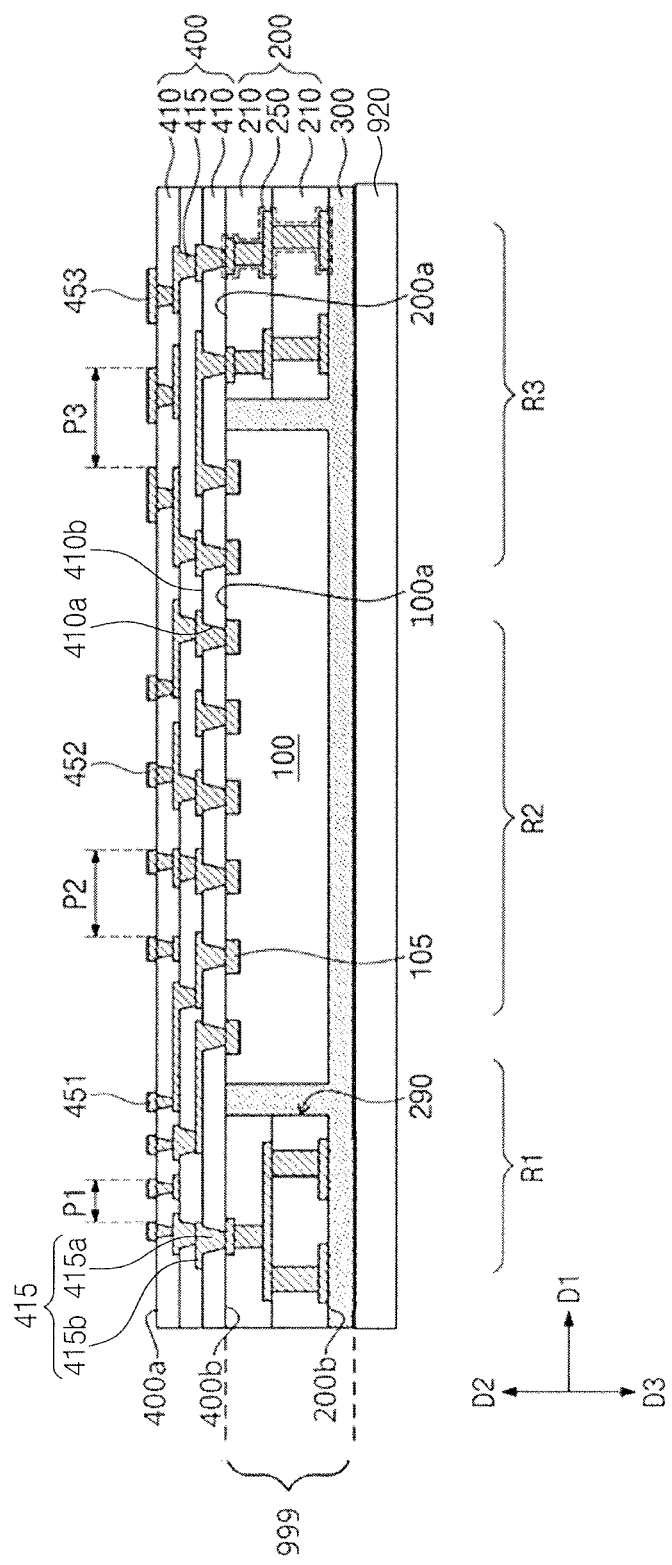

Referring sequentially to FIGS. 2C and 2D, the structure of FIG. 2C may be flipped, e.g., turned upside-down, and the first carrier substrate 910 may be removed to expose the surface 100a of the semiconductor chip 100 and the first surface 200a of the wiring substrate 200. The preliminary package 999 may be turned upside down in such a way that the surface 100a of the semiconductor chip 100 may face upward, and the second carrier substrate 920 may define a bottom of the structure in FIG. 2D.

Referring to FIGS. 1A, 1B, and 2E, a redistribution layer 400 may be formed on a top surface of the preliminary package 999. For example, the redistribution layer 400 may be formed, e.g., directly, on the surface 100a of the semiconductor chip 100 and the first surface 200a of the wiring substrate 200. The redistribution layer 400 may include at least one insulation pattern 410 with redistribution patterns 415 therein.

In detail, referring to FIG. 2E, the at least one insulation pattern 410 may be formed, e.g., directly, on the top surface of the preliminary package 999, covering the semiconductor chip 100 and the wiring substrate 200. The insulation pattern 410 may include a photosensitive polymer. The photosensitive polymer may include, e.g., one or more of photosensitive polyimide (PSPI), polybenzoxazole (PBO), phenolic polymer, and benzocyclobutene (BCB) polymer. The formation of the insulation pattern 410 may include coating a polymer to form a polymer layer and patterning the polymer layer. The patterning of the polymer layer may include performing exposure and development processes. The insulation pattern 410 may have openings 410a therethrough that expose the chip pads 105 and the conductive structures 250.

The redistribution patterns 415 may be formed on the insulation pattern 410, e.g., in the openings 410a through the insulation pattern 410 and on a top surface 410b thereof. In some embodiments, a seed layer may be formed on the insulation pattern 410. An electroplating process may be performed using the seed layer as an electrode, and as a result, a conductive layer may be formed. The conductive layer may include metal, e.g., copper. The seed layer and the conductive layer may be patterned to form the redistribution patterns 415. The redistribution patterns 415 may include via portions 415a provided in the openings 410a of the insulation pattern 410 and line portions 415b disposed on the top surface 410b of the insulation pattern 410. For example, as illustrated in FIG. 2E, the via portions 415a of the redistribution patterns 415 may fill the openings 410a of the insulation pattern 410 to contact respective ones of the chip pads 105 and the conductive structures 250, and the line portions 415b of the redistribution patterns 415 may extend from respective ones of the via portions 415a, e.g., in a linear form, along the top surface 410b of the insulation pattern 410.

As illustrated in FIG. 2E, the formation of the insulation pattern 410 and the formation of the redistribution patterns 415 may be repeatedly performed, e.g., three insulation patterns 410 may be stacked on top of each other with redistribution patterns 415 penetrating each of the insulation patterns 410. The redistribution patterns 415 may be electrically connected to the chip pads 105 and the conductive structures 250.

Referring to FIGS. 1A and 2E, first redistribution pads 451, second redistribution pads 452, and third redistribution pads 453 may be provided on an uppermost one of the insulation patterns 410. The redistribution pads 451, 452, and 453 may be coupled to the redistribution patterns 415 in underlying insulation patterns 410. The redistribution layer 400 may therefore be fabricated. The redistribution layer 400 may include a plurality of the insulation patterns 410, the redistribution patterns 415 inside and between the insulation patterns 410, and the redistribution pads 451, 452, and 453 on the uppermost one of the insulation patterns 410. The numbers of the insulation patterns 410 and the redistribution patterns 415 are not limited to that shown, and may be variously changed. For example, the redistribution layer 400 may include a single redistribution pattern 415.

The redistribution layer 400 may be provided on the semiconductor chip 100 and the wiring substrate 200. As illustrated in FIG. 1A, the redistribution layer 400 may have a width greater than that of the semiconductor chip 100 along a fourth direction D4. As further illustrated in FIG. 1A, the redistribution layer 400 may have a length greater than that of the semiconductor chip 100 along the first direction D1. The redistribution layer 400 may have a relatively small thickness along the second direction D2 (FIG. 2E). For example, the redistribution layer 400 may be thinner than the wiring substrate 200 along the second direction D2.

As illustrated in FIG. 2E, the redistribution layer 400 may have a first surface 400a and a second surface 400b opposite to each other. The second surface 400b of the redistribution layer 400 may face, e.g., be directly on, the semiconductor chip 100. When viewed in a plan view, as illustrated in FIG. 1A, the redistribution layer 400 may have a first region R1, a second region R2, and a third region R3. For example, as illustrated in FIG. 1A, the first region R1 may refer to a region of the redistribution layer 400 including the first redistribution pads 451 above the wiring substrate 200 (e.g., left of the semiconductor chip 100), the second region R2 may refer to a region of the redistribution layer 400 including the second redistribution pads 452 above the semiconductor chip 100, and the third region R3 may refer to a region of the redistribution layer 400 including the third redistribution pads 453 above the wiring substrate 200 (e.g., right of the semiconductor chip 100). The following describes in detail the redistribution pads 451, 452, and 453.

Referring to FIGS. 1A and 2E, the first redistribution pads 451 may be provided on the first surface 400a of the first region R1 of the redistribution layer 400. Since the redistribution layer 400 is provided on the wiring substrate 200, the first redistribution pads 451 may be variously arranged, e.g., the first redistribution pads 451 may be arranged in a matric pattern along a side of the semiconductor chip 100 (FIG. 1A). For example, when viewed in a plan view, as illustrated in FIG. 1A, at least one of the first redistribution pads 451 may be spaced apart from the semiconductor chip 100, e.g., a rightmost column of the first redistribution pads 451 may be arranged along and spaced apart along the first direction D1 from a side of the semiconductor chip 100 (FIG. 1A). For example, as illustrated in FIG. 2E, some of the first redistribution pads 451, e.g., first and second right columns of the first redistribution pads 451 in FIG. 1A, may be coupled through the redistribution patterns 415 to the chip pads 105 of the semiconductor chip 100, and some of the first redistribution pads 451, e.g., a leftmost column of the first redistribution pads 451 in FIG. 1A, may be coupled through the redistribution patterns 415 to the conductive structures 250.

The first redistribution pads 451 may be arranged at a first pitch P1 along the first direction D1 and the fourth direction D4. For example, the first pitch P1 may fall within a range from about 50 μm to about 200 μm. However, the first pitch P1 is not limited to the above range, and may be variously changed.

The second redistribution pads 452 may be provided on the first surface 400a of the second region R2 of the redistribution layer 400. The second redistribution pads 452 may be coupled through the redistribution patterns 415 to the chip pads 105. However, embodiments are not limited thereto, e.g., some of the second redistribution pads 452 may be coupled through the redistribution patterns 415 to the conductive structures 250. The second redistribution pads 452 may be arranged at a second pitch P2, e.g., along the first direction D1 and the fourth direction D4. For example, the second pitch P2 may be greater than the first pitch P1.

Figure 2F:
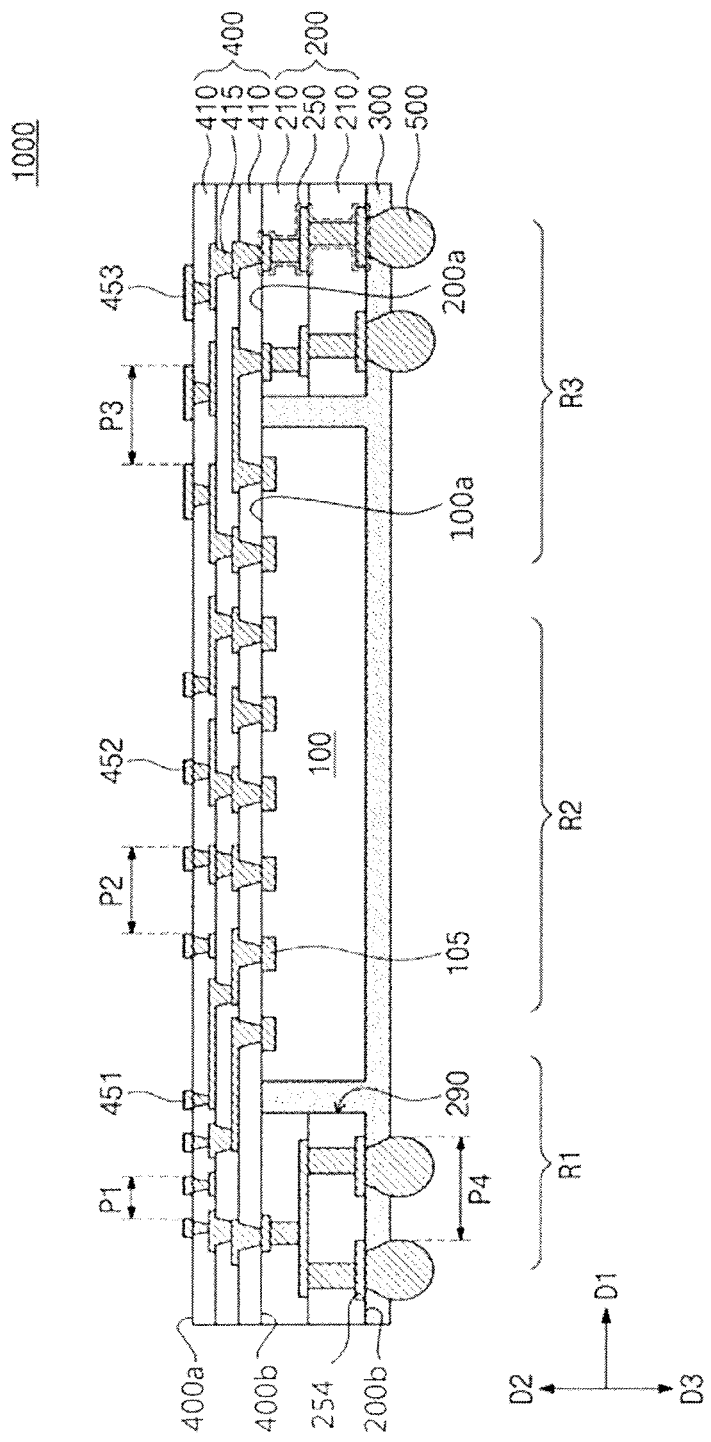

The third redistribution pads 453 may be provided on the first surface 400a of the third region R3 of the redistribution layer 400. When viewed in a plan view, as illustrated in FIG. 1A, at least one of the third redistribution pads 453 may be spaced apart from the semiconductor chip 100, e.g., the first and second right columns of the third redistribution pads 453 may be spaced apart from the semiconductor chip 100 along the first direction D1 (FIG. 1A). For example, as further illustrated in FIG. 1A, a leftmost column of the third redistribution pads 453 may be above the semiconductor chip 100 to overlap an edge of the semiconductor chip 100. As illustrated in FIG. 2F, some of the third redistribution pads 453 may be coupled to the chip pads 105. e.g., the leftmost column of the third redistribution pads 453 in FIG. 1A, and some of the third redistribution pads 453 may be coupled to the conductive structures 250, e.g., the rightmost column of the third redistribution pads 453 in FIG. 1A.

The third redistribution pads 453 may be arranged at a third pitch P3, e.g., along the first direction D1 and the fourth direction D4. The third pitch P3 may be different from the first and second pitches P1 and P2. For example, the third pitch P3 may be greater than each of the first and second pitches P1 and P2. However, magnitude relation between the first to third pitches P1, P2, and P3 is not limited to the mentioned above, and may be variously changed.

Referring to FIGS. 2E and 2F, the second carrier substrate 920 may be removed from the molding pattern 300 to expose a bottom surface (e.g., of the molding pattern 300) of the preliminary package 999.

Referring to FIGS. 1A, 1B, and 2F, external connection terminals 500 may be provided on the bottom surface of the preliminary package 999, i.e., on the molding pattern 300, to be coupled to the conductive structures 250. The external connection terminals 500 may be provided on the second surface 200b of the wiring substrate 200. For example, openings may be formed in the molding pattern 300, exposing the conductive structures 250, i.e., exposing the second pads 254 of the conductive structures 250. The external connection terminals 500 may be formed in the openings of the molding pattern 300, thereby being coupled to the second pads 254 of the conductive structures 250. For example, as illustrated in FIG. 1B, the external connection terminals 500 may be formed around a perimeter of the hole 290, which in turn, may surround the semiconductor chip 100.

Referring to FIGS. 1B and 2F, the external connection terminals 500 may be arranged at a fourth pitch P4, e.g., along the first and fourth directions D1 and D4. The fourth pitch P4 may be identical or similar to a pitch of the second pads 254. The fourth pitch P4 may be determined by a pitch of terminals to which the external connection terminals 500 are electrically connected. The fourth pitch P4 may be greater than a minimum pitch of the redistribution pads 451, 452, and 453. For example, the fourth pitch P4 may be greater than the minimum of the first to third pitches P1, P2, and P3. The fourth pitch P4 may be, e.g., greater than the first pitch P1. The fourth pitch P4 may fall within a range from about 200 µm to about 800 µm. The external connection terminals 500 may include a conductive material, e.g., tin (Sn), lead (Pb), indium (In), or an alloy thereof. An interconnect package 1000 may therefore be formed. The interconnect package 1000 may be fabricated as a fan-out panel level package. The redistribution layer 400 may have a relatively small thickness, and thus the interconnect package 1000 may become compact-sized.

Figure 3A:
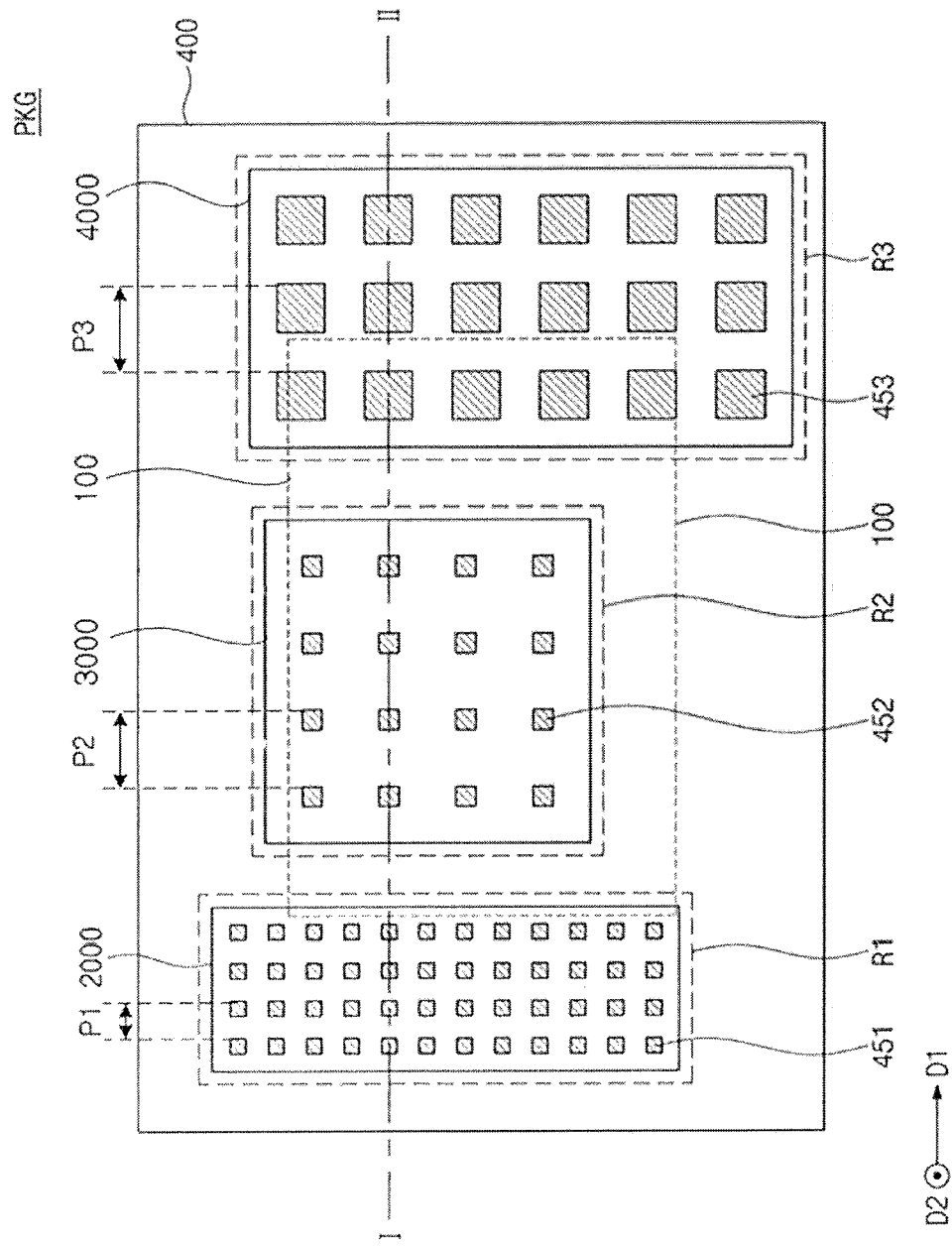
FIG. 3A illustrates a plan view of a semiconductor package according to exemplary embodiments.
Figure 3B:
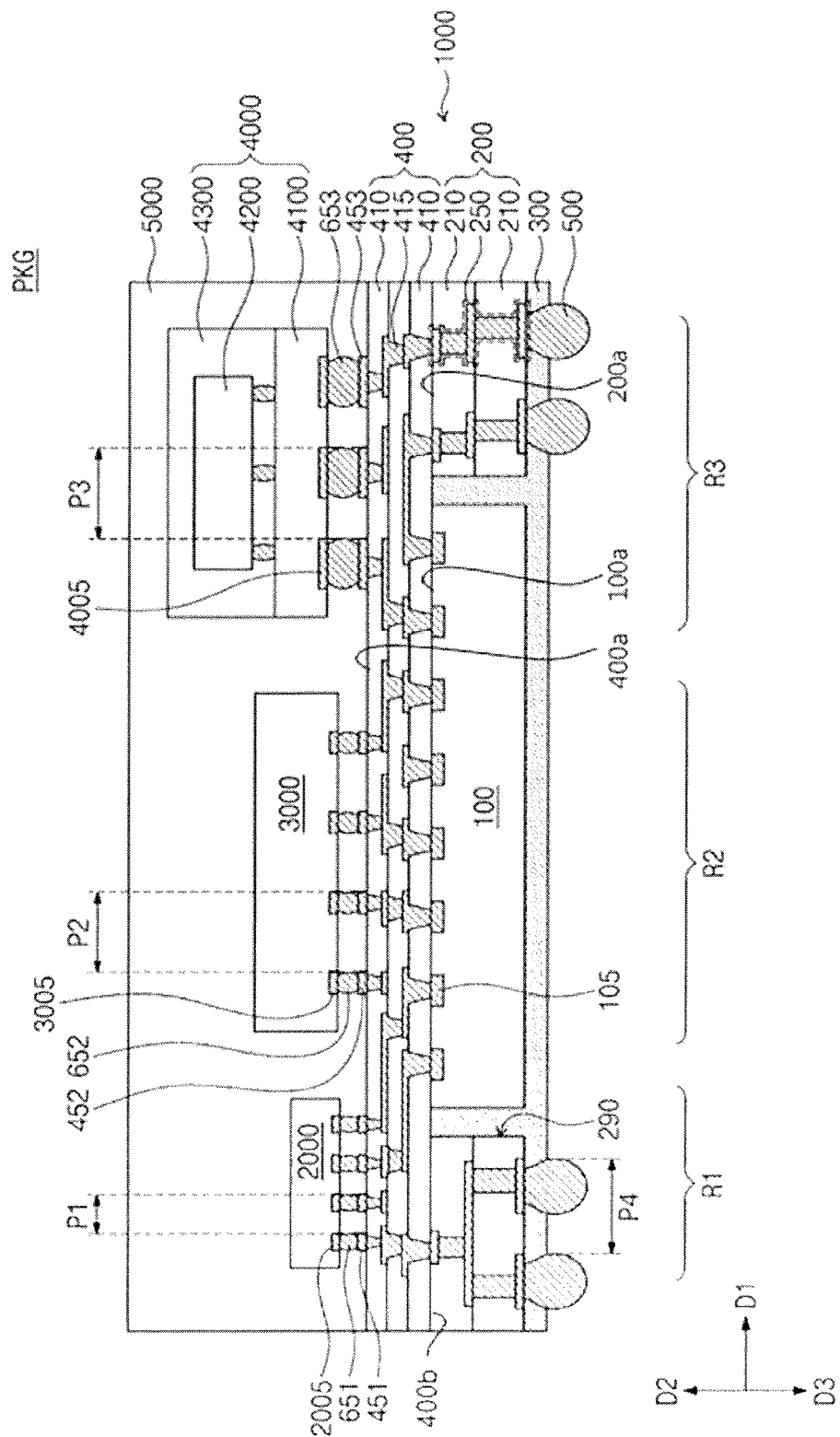
FIG. 3B illustrates a cross-sectional view along line I-II of FIG. 3A.

FIG. 3A illustrates a plan view showing a semiconductor package according to exemplary embodiments. FIG. 3B illustrates a cross-sectional view corresponding to line I-II of FIG. 3A. A description duplicate with the aforementioned will be omitted hereinafter. The following also references FIG. 1B.

Referring to FIGS. 3A and 3B, a first semiconductor device 2000, a second semiconductor device 3000, and a third semiconductor device 4000 may be mounted on the interconnect package 1000, which step may fabricate a semiconductor package PKG. The interconnect package 1000 may be fabricated as discussed above with reference to FIGS. 2A to 2F.

The first semiconductor device 2000 may be disposed on the first surface 400a of the first region R1 of the redistribution layer 400. The first semiconductor device 2000 may be a semiconductor chip. The first semiconductor device 2000 may include connection pads 2005 whose pitch and size (e.g., a planar area) are relatively small. For example, the connection pads 2005 of the first semiconductor device 2000 may be arranged at a pitch ranging from about 50 µm to about 200 µm.

First connectors 651 may be formed between the first semiconductor device 2000 and the redistribution layer 400, thereby coupling to the connection pads 2005 of the first semiconductor device 2000 and also to the first redistribution pads 451. The first connectors 651 may include solder balls, bumps, and/or pillars. The first connectors 651 may be arranged at a pitch identical or similar to the pitch of the connection pads 2005 of the first semiconductor device 2000 and the first pitch P1 of the first redistribution pads 451. Therefore, the first pitch P1 of the first redistribution pads 451 may be determined by the pitch of the connection pads 2005 of the first semiconductor device 2000. The first semiconductor device 2000 may be electrically connected through the redistribution layer 400 to the semiconductor chip 100 and the conductive structures 250. In this description, the phrase "electrically connected/coupled to the redistribution layer 400" may mean "electrically connected/coupled to the redistribution pattern(s) 415." The phrase "electrically connected/coupled to the semiconductor chip 100" may mean "electrically connected/coupled to the chip pads 105 of the semiconductor chip 100 and integrated circuits in the semiconductor chip 100."

The second semiconductor device 3000 may be disposed on the first surface 400a of the second region R2 of the redistribution layer 400. The second semiconductor device 3000 may be a semiconductor chip. The second semiconductor device 3000 may include connection pads 3005 whose pitch and size (e.g., a planar area) are relatively small. Second connectors 652 may be formed between the second semiconductor device 3000 and the redistribution layer 400, thereby coupling to the connection pads 3005 of the second semiconductor device 3000 and also to the second redistribution pads 452. The second connectors 652 may include solder balls, bumps, and/or pillars. The second pitch P2 of the second redistribution pads 452 may be determined by a pitch of the connection pads 3005 of the second semiconductor device 3000. The second pitch P2 may be relatively small. For example, the second pitch P2 may fall within a range from about 50 µm to about 200 µm. The second semiconductor device 3000 may be electrically connected through the redistribution layer 400 to the semiconductor chip 100 and the conductive structures 250. In addition, the second semiconductor device 3000 may be electrically connected through the redistribution layer 400 to the first semiconductor device 2000.

The third semiconductor device 4000 may be disposed on the first surface 400a of the third region R3 of the redistribution layer 400. The third semiconductor device 4000 may be a semiconductor package. For example, the third semiconductor device 4000 may include a package substrate 4100, a first semiconductor chip 4200, and a molding member 4300. For example, the first semiconductor chip 4200 may be disposed on the package substrate 4100. In another example, the first semiconductor chip 4200 may be provided in plural. The molding member 4300 may disposed on the package substrate 4100 to encapsulate the first semiconductor chip 4200. The connection pads 4005 may be provided on a bottom surface of the package substrate 4100. The connection pads 4005 of the third semiconductor device 4000 may be arranged at a relatively large pitch.

Third connectors 653 may be formed between the third semiconductor device 4000 and the redistribution layer 400, thereby coupling to the connection pads 4005 of the third semiconductor device 4000 and also to the third redistribution pads 453. The third connectors 653 may include solder balls, bumps, and/or pillars. The third connectors 653 may be arranged at a pitch substantially the same as the pitch of the connection pads 4005 of the third semiconductor device 4000 and the third pitch P3 of the third redistribution pads 453. The third pitch P3 may be determined by the pitch of the connection pads 4005 of the third semiconductor device 4000. The third semiconductor device 4000 may be electrically connected through the redistribution layer 400 to the semiconductor chip 100 and the conductive structures 250. In addition, the third semiconductor device 4000 may be electrically connected through the redistribution layer 400 to the first semiconductor device 2000 and/or the second semiconductor device 3000.

The first semiconductor device 2000 may be different from the second and third semiconductor devices 3000 and 4000. The third semiconductor device 4000 may be different from the second semiconductor device 3000. The phrase "the semiconductor devices 2000, 3000, and 4000 are different from each other" may mean "the semiconductor devices 2000, 3000, and 4000 are different in at least one of size, function, and storage capacity." In this description, the size of each of the semiconductor devices 2000, 3000, and 4000 may include a height, a width, and a length.

A user may have difficulty in controlling pitches and sizes of the connection pads 2005 of the first semiconductor device 2000, the connection pads 3005 of the second semiconductor device 3000, and the connection pads 4005 of the third semiconductor device 4000. In some embodiments, since the first to third redistribution pads 451, 452, and 453 are coupled through the redistribution layer 400 to the chip pads 105 of the semiconductor chip 100 and/or to the conductive structures 250, pitches and arrangements of the redistribution pads 451, 452, and 453 may be freely changed without being limited by pitches and arrangements of the chip pads 105 and the conductive structures 250. Although the connection pads 2005, 3005, and 4005 of the semiconductor devices 2000, 3000, and 4000 have different pitches from each other, the pitches of the first to third redistribution pads 451, 452, and 453 may be easily adjusted in response to the difference in pitch between the connection pads 2005, 3005, and 4005.

The interconnect package 1000 according to some embodiments may be configured so that the redistribution pads 451, 452, and 453 may be formed to have respective pitches P1, P2, and P3 that are different from each other in accordance with the regions R1, R2, and R3 of the redistribution layer 400. The interconnect package 1000 may be used to standardize and systematize an electrical connection between the semiconductor chip 100 and the semiconductor devices 2000, 3000, and 4000. When a user wants to electrically connect the semiconductor chip 100 to a specific semiconductor device, the interconnect package 1000 may be used for an electrical connection with the specific semiconductor device. The user may mount the specific semiconductor device on its corresponding region (e.g., one of the regions R1, R2, and R3) of the redistribution layer 400. The corresponding region may mean a region provided with ones of the redistribution pads 451, 452, and 453, which ones have pitch and arrangement conforming to those of connection pads of the specific semiconductor device. For example, when it is required an electrical connection between the first semiconductor device 2000 and the semiconductor chip 100, the first semiconductor device 2000 may be placed on the first region R1 of the redistribution layer 400, which configuration may easily couple the first semiconductor device 2000 to the first redistribution pads 451.

In some embodiments, the connection pads 2005, 3005, and 4005 of the semiconductor devices 2000, 3000, and 4000 may be provided on bottom surfaces of the semiconductor devices 2000, 3000 and 4000. The bottom surfaces of the semiconductor devices 2000, 3000, and 4000 may face the redistribution layer 400. The chip pads 105 of the semiconductor chip 100 may be provided on the surface 100a of the semiconductor chip 100, which surface 100a may face the redistribution layer 400. For example, the semiconductor chip 100 and the semiconductor devices 2000, 3000, and 4000 may be connected in a face-to-face manner through the redistribution layer 400. An electrical path may thus be decreased between the semiconductor chip 100 and the semiconductor devices 2000, 3000, and 4000. The semiconductor package PKG may increase in operating speed.

If the redistribution layer 400 were not provided or did not extend onto the wiring substrate 200, the semiconductor devices 2000, 3000, and 4000 would have been limitedly disposed on the semiconductor chip 100, e.g., only in regions overlapping the semiconductor chip 100. In contrast, according to embodiments, the interconnect package 1000 may include the redistribution layer 400 which extends onto the surface 200a of the wiring substrate 200, e.g., along the first and fourth direction D1 and D4 around the entire perimeter of the semiconductor chip 100. Therefore, the semiconductor devices 2000, 3000, and 4000 may not be limitedly disposed only on the semiconductor chip 100, but may be freely placed.

For example, when viewed in a plan view, only a portion of each of the first and third semiconductor devices 2000 and 4000 may overlap the semiconductor chip 100. A planar arrangement of the semiconductor devices 2000, 3000, and 4000 may not be limited to that shown, but variously changed. The semiconductor devices 2000, 3000, and 4000 may be electrically connected to an external device through the redistribution layer 400 and the conductive structures 250. The semiconductor devices 2000, 3000, and 4000 may further have an electrical path connected to the external device without through the semiconductor chip 100. Therefore, the semiconductor devices 2000, 3000, and 4000 may have an electrical path that can be freely designed. When the electrical path is a power/ground voltage supply path, limitation of the electrical path may be further decreased.

The second semiconductor device 3000 may have a height greater than that of the first semiconductor device 2000 along the second direction D2. The third semiconductor device 4000 may have a height greater than those of the first and second semiconductor devices 2000 and 3000 along the second direction D2.

The first to third semiconductor devices 2000, 3000, and 4000 may perform different functions from one another. For example, of the first to third semiconductor devices 2000, 3000, and 400, one may include a power management integrated circuit, another may include a radio frequency device, and the last one may include a fingerprint sensing device.

The interconnect package 1000 may have good compatibility. As discussed above, although the semiconductor devices 2000, 3000, and 4000 are different in size, function, storage capacity, and pitch of the connection pads 2005, 3005, and 4005, the interconnect package 1000 may be coupled to the semiconductor devices 2000, 3000, and 4000.

In some embodiments, various types of semiconductor devices may be used as the first to third semiconductor devices 2000, 3000, and 4000. For example, the third semiconductor device 4000 may be a semiconductor chip. In another example, at least one of the first and second semiconductor devices 2000 and 3000 may be a semiconductor package. In another example, one or more of the first to third semiconductor devices 2000, 3000, and 4000 may be a package-on-package, a multichip package in which a plurality of chips are stacked, or a system-in-package. The redistribution pads 451, 452, and 453 may be adjusted in pitch and type, based on kinds of the first to third semiconductor devices 2000, 3000, and 4000.

In some embodiments, a molding layer 5000 may further be formed on the first surface 400a of the redistribution layer 400, covering the first to third semiconductor devices 2000, 3000, and 4000. The molding layer 5000 may include an insulating polymer, e.g., an epoxy-based molding compound.

Figure 4:
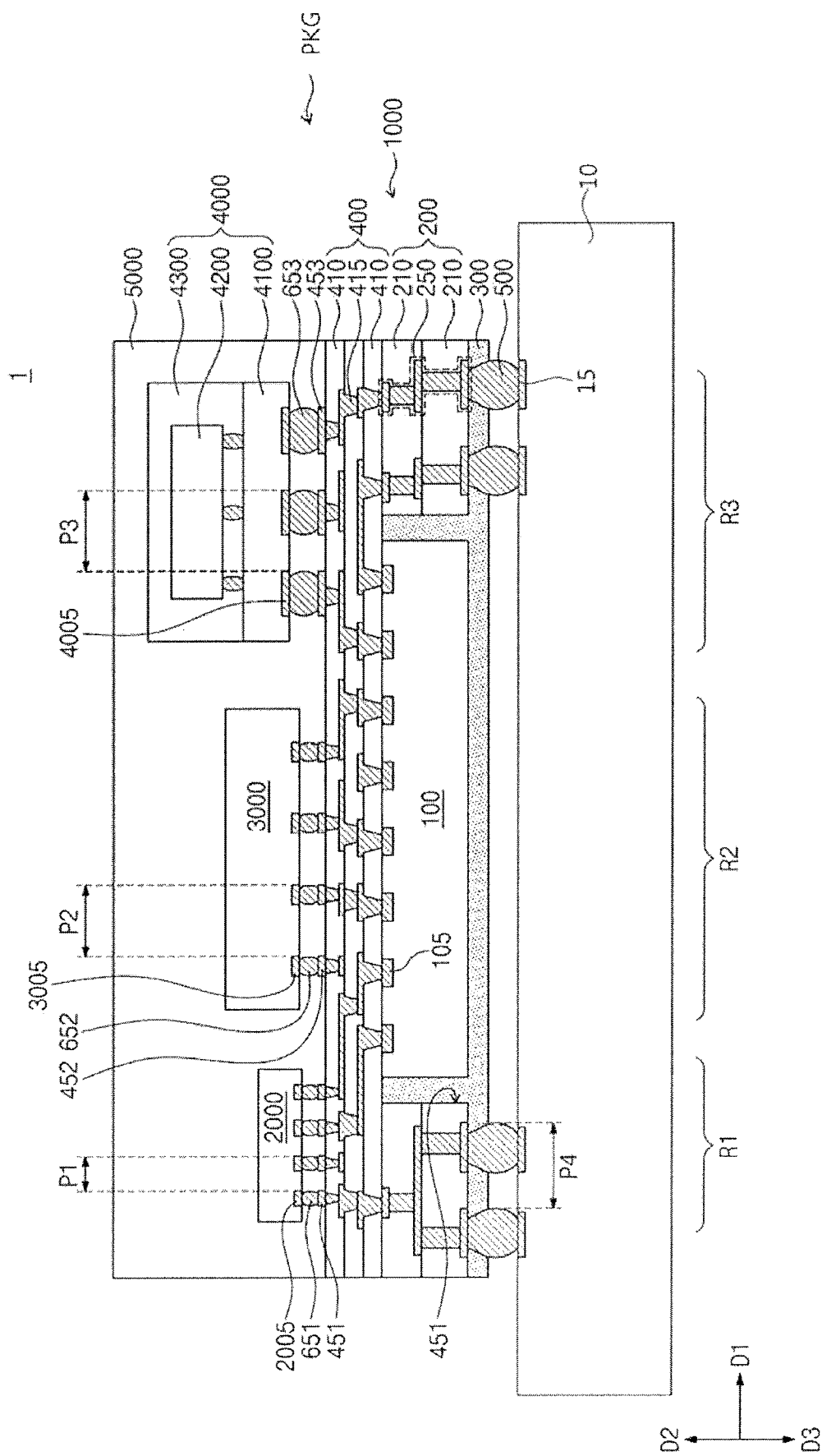
FIG. 4 illustrates a cross-sectional view of a package module according to exemplary embodiments.

FIG. 4 illustrates a cross-sectional view showing a package module according to exemplary embodiments. A description duplicate with the aforementioned will be omitted hereinafter.

Referring to FIGS. 3A and 4, a package module 1 may include a module substrate 10 and the semiconductor package PKG. A PCB may be used as the module substrate 10. The module substrate 10 may have conductive pads 15 on a top surface thereof. The conductive pads 15 may be arranged at a relatively large pitch. Therefore, it may be required that terminals coupled to the conductive pads 15 be arranged at a relatively large pitch.

The semiconductor package PKG may be mounted on the module substrate 10. The semiconductor package PKG may be disposed on the module substrate 10 in such a way that the external connection terminals 500 of the semiconductor package PKG may be aligned with the conductive pads 15. The external connection terminals 500 may be arranged at the fourth pitch P4. The fourth pitch P4 may be substantially identical or similar to a pitch of the conductive pads 15. The external connection terminals 500 may be coupled to the conductive pads 15, and thus the semiconductor package PKG may be electrically connected to the module substrate 10. The phrase "electrically connected to the module 10" may mean "electrically connected to electrical lines (not shown) in the module substrate 10."

Figure 5A:
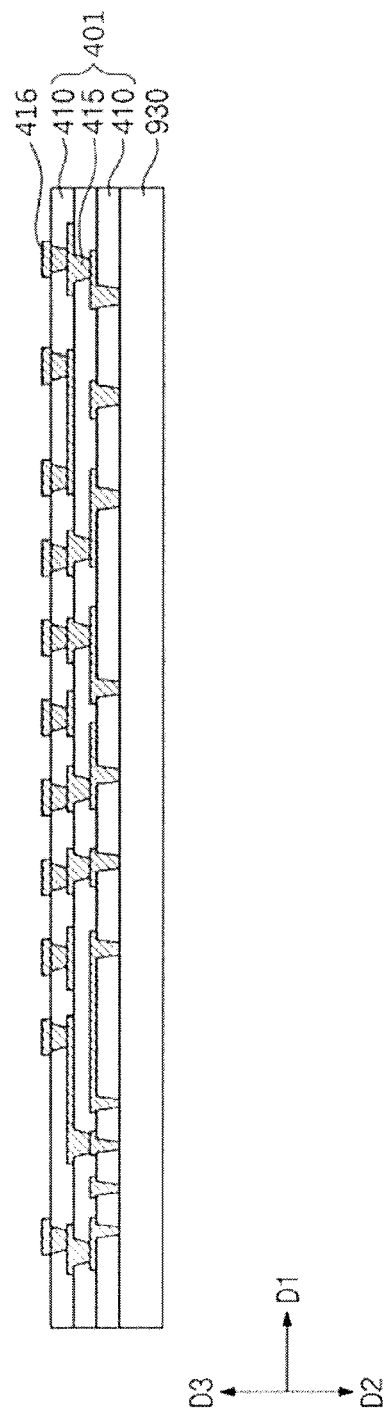
FIGS. 5A to 5C illustrate cross-sectional views of stages in a method of fabricating an interconnect package according to exemplary embodiments.
Figure 5B:
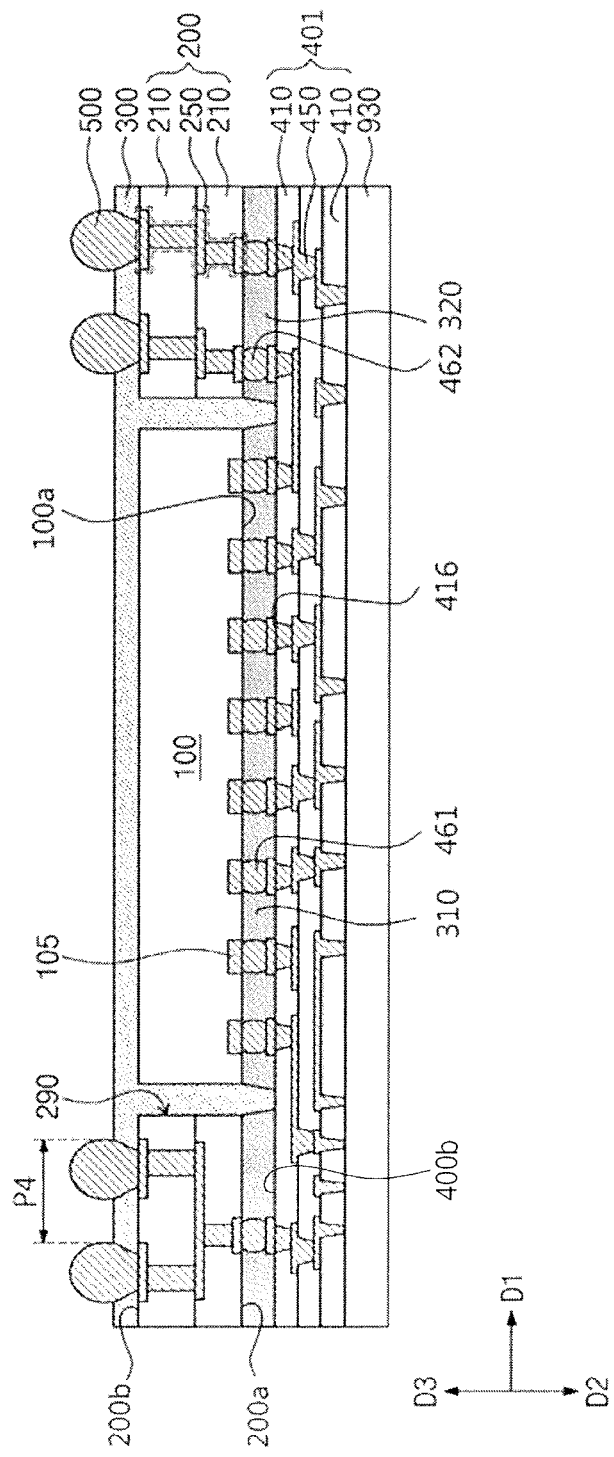
Figure 5C:
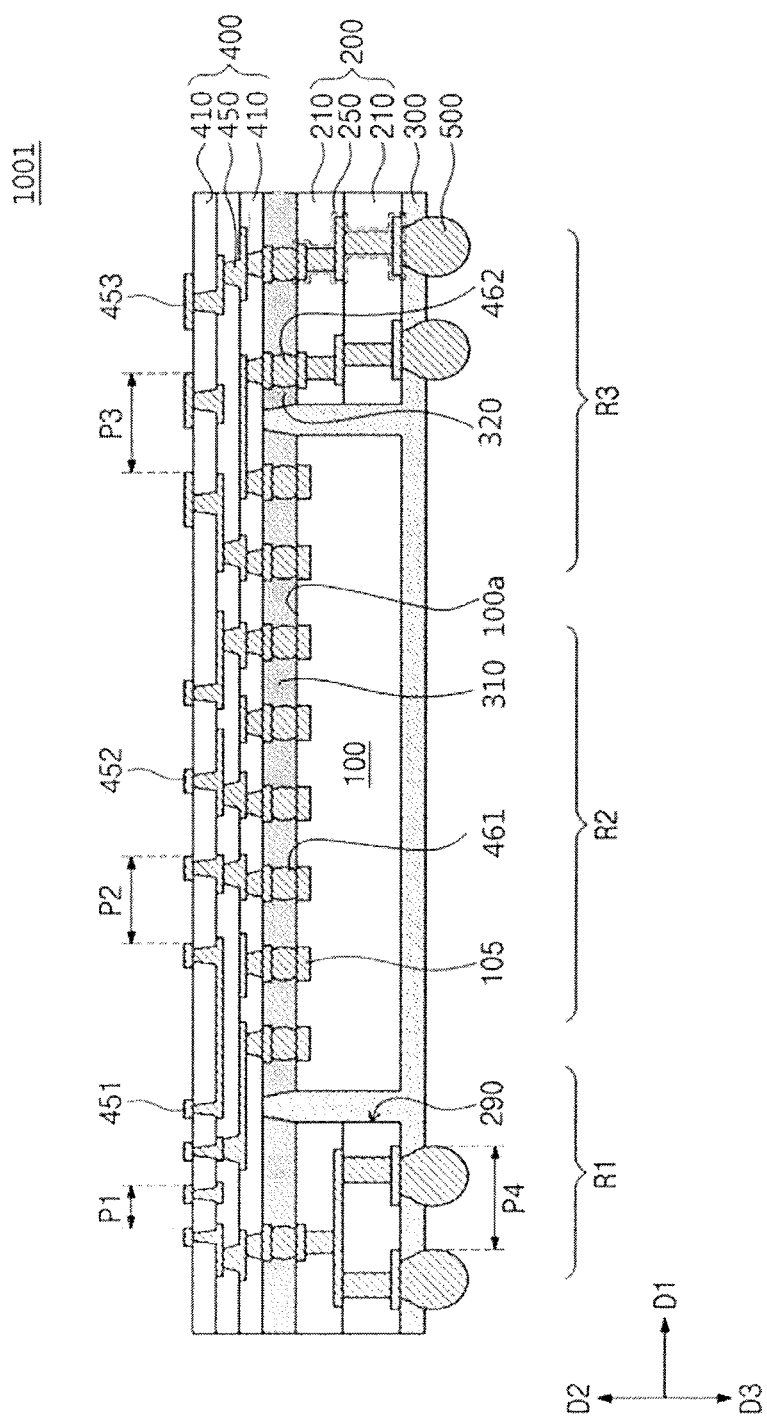

FIGS. 5A to 5C illustrate cross-sectional views corresponding line I-II of FIG. 1A, showing a method of fabricating an interconnect package according to exemplary embodiments. A description duplicate with the aforementioned will be omitted hereinafter.

Referring to FIGS. 1A and 5A, the insulation patterns 410 and the redistribution patterns 415 may be formed on a third carrier substrate 930, which may form a preliminary redistribution layer 401. One of the insulation patterns 410 may cover the third carrier substrate 930. The redistribution patterns 415 may be interposed between the insulation patterns 410. The insulation patterns 410 and the redistribution patterns 415 may be formed by processes substantially the same as those discussed above with reference to FIG. 2E. Conductive pads 416 may be formed on the preliminary redistribution layer 401 and coupled to the redistribution patterns 415.

Referring to FIGS. 1A, 1B, and 5B, the semiconductor chip 100 and the wiring substrate 200 may be disposed on the preliminary redistribution layer 401. The semiconductor chip 100 may include the chip pads 105, and the wiring substrate 200 may include the conductive structures 250. The semiconductor chip 100 may be placed on the preliminary redistribution layer 401 in such a way that the surface 100a of the semiconductor chip 100 may face the preliminary redistribution layer 401. When viewed in a plan view, the semiconductor chip 100 may be disposed on a central region of the preliminary redistribution layer 401.

First conductive interposers 461 may be formed between the semiconductor chip 100 and the preliminary redistribution layer 401, thereby coupling to the chip pads 105 and the conductive pads 416. The semiconductor chip 100 may thus be electrically connected to the redistribution patterns 415. The first conductive interposers 461 may include solder balls, bumps, and/or pillars. A first under-fill pattern 310 may be formed in a gap between the semiconductor chip 100 and the preliminary redistribution layer 401, encapsulating the first conductive interposers 461.

The wiring substrate 200 may be placed on the preliminary redistribution layer 401 in such a way that the first surface 200a of the wiring substrate 200 may face the second surface 400b of the preliminary redistribution layer 401. The semiconductor chip 100 may be provided in the hole 290 of the wiring substrate 200.

Second conductive interposers 462 may be formed between the wiring substrate 200 and the preliminary redistribution layer 401, thereby coupling to the conductive structures 250 and the conductive pads 416. The conductive structures 250 may thus be electrically connected to the redistribution patterns 415. The second conductive interposers 462 may include solder balls, bumps, and/or pillars. A second under-fill pattern 320 may further be formed in a gap between the wiring substrate 200 and the preliminary redistribution layer 401, encapsulating the second conductive interposers 462. The first and second under-fill patterns 310 and 320 may include an insulating resin (e.g., an epoxy-based resin).

The molding pattern 300 may be formed on the semiconductor chip 100 and the wiring substrate 200. The molding pattern 300 may fill a gap between the semiconductor chip 100 and the wiring substrate 200. External connection terminals 500 may be formed on the second surface 200b of the wiring substrate 200, thereby coupling to the conductive structures 250.

Referring to FIGS. 1A, 1B, and 5C, the semiconductor chip 100, the wiring substrate 200, the molding pattern 300, and the preliminary redistribution layer 401 may be turned upside down in such a way that the surface 100a of the semiconductor chip 100 may face upward. The third carrier substrate 930 may be removed to expose the preliminary redistribution layer 401.

First redistribution pads 451, second redistribution pads 452, and third redistribution pads 453 may be formed on the exposed preliminary redistribution layer 401, which may finalize the redistribution layer 400. The formation and arrangement of the redistribution pads 451, 452, and 453 may be substantially the same as those discussed above. An interconnect package 1001 may therefore be eventually fabricated.

Figure 6:
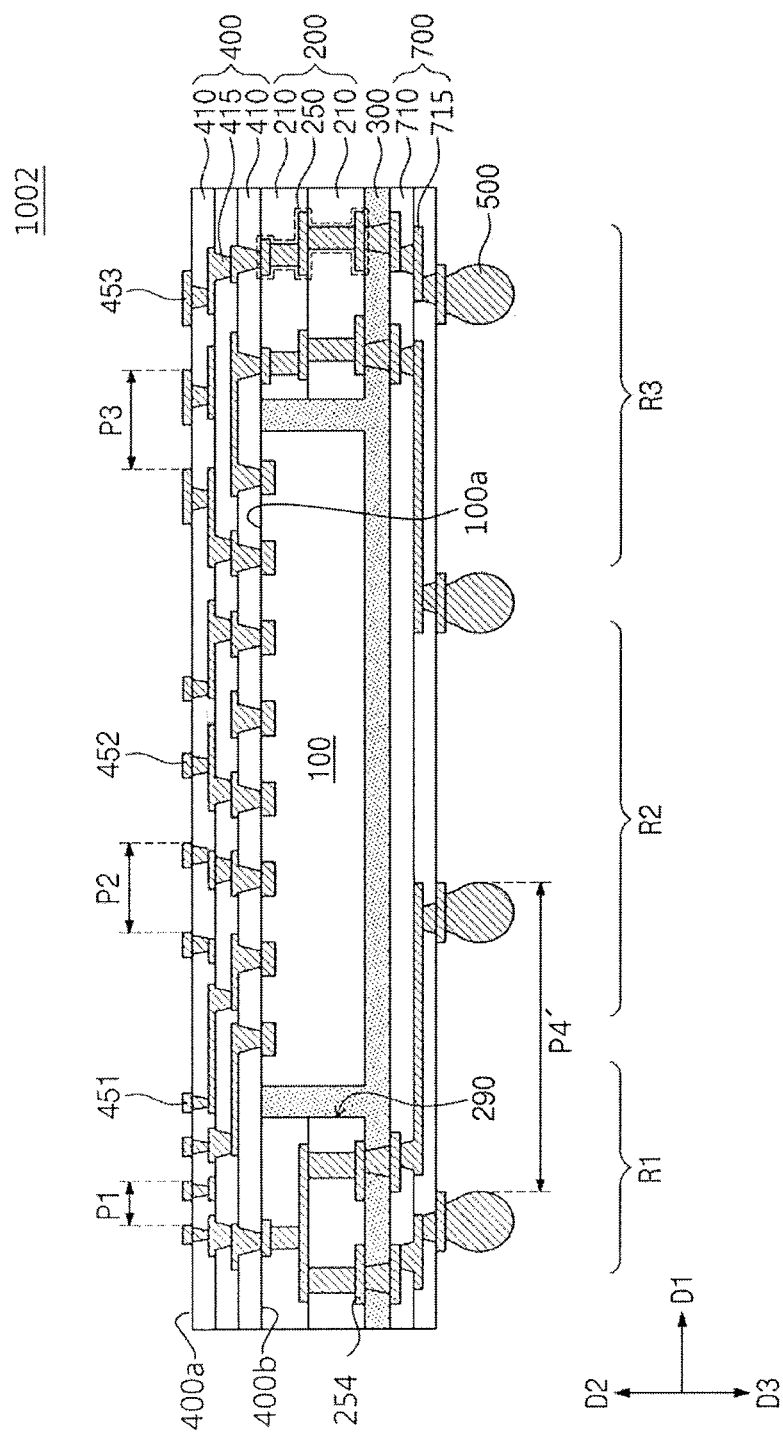
FIG. 6 illustrates a cross-sectional view of an interconnect package according to exemplary embodiments.

FIG. 6 illustrates a cross-sectional view corresponding to line I-II of FIG. 1A, showing an interconnect package according to exemplary embodiments. A description duplicate with the aforementioned will be omitted hereinafter.

Referring to FIGS. 1A and 6, an interconnect package 1002 may include the semiconductor chip 100, the wiring substrate 200, the molding pattern 300, the redistribution layer 400, and a lower redistribution layer 700. The semiconductor chip 100, the wiring substrate 200, the molding pattern 300, and the redistribution layer 400 may be formed as discussed in the example of FIGS. 2A to 2F or FIGS. 5A to 5C.

The lower redistribution layer 700 may be formed on a bottom surface of the molding pattern 300 and bottom surfaces of the conductive structures 250. In some embodiments, lower holes may be formed in the molding pattern 300, exposing the conductive structures 250. The lower holes may expose, for example, the second pads 254. The lower redistribution layer 700 may include lower insulation patterns 710 and lower redistribution patterns 715. The lower insulation patterns 710 may be stacked on the molding pattern 300. Each of the lower redistribution patterns 715 may include a line portion and a via portion. The line portions may be provided on surfaces of the lower insulation patterns 710. The via portions may penetrate the lower insulation patterns 710 or may be provided in the lower holes in the molding pattern 300. The lower redistribution patterns 715 may be coupled to the conductive structures 250. The external connection terminals 500 may be formed on the lower redistribution layer 700, thereby coupling to the lower redistribution patterns 715.

The external connection terminals 500 may be arranged at a fourth pitch P4'. The fourth pitch P4' may be different from a pitch of the second pads 254 of the conductive structures 250. The external connection terminals 500 may be arranged differently from the second pads 254 of the conductive structures 250. For example, the external connection terminals 500 may not be aligned in the second direction D2 with the second pads 254 of the conductive structures 250. In some embodiments, the lower redistribution layer 700 may be provided to more freely design an arrangement of the external connection terminals 500.

Figure 7A:
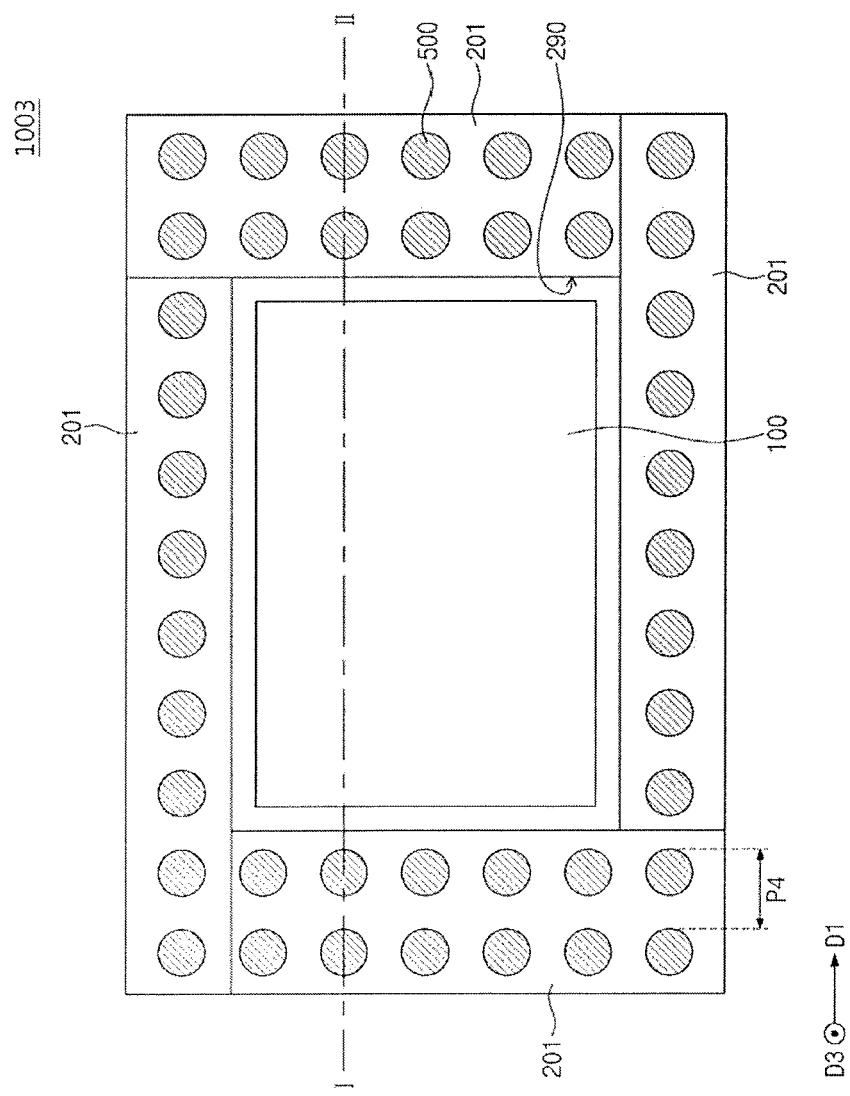
FIG. 7A illustrates a plan view of a wiring substrate according to exemplary embodiments.
Figure 7B:
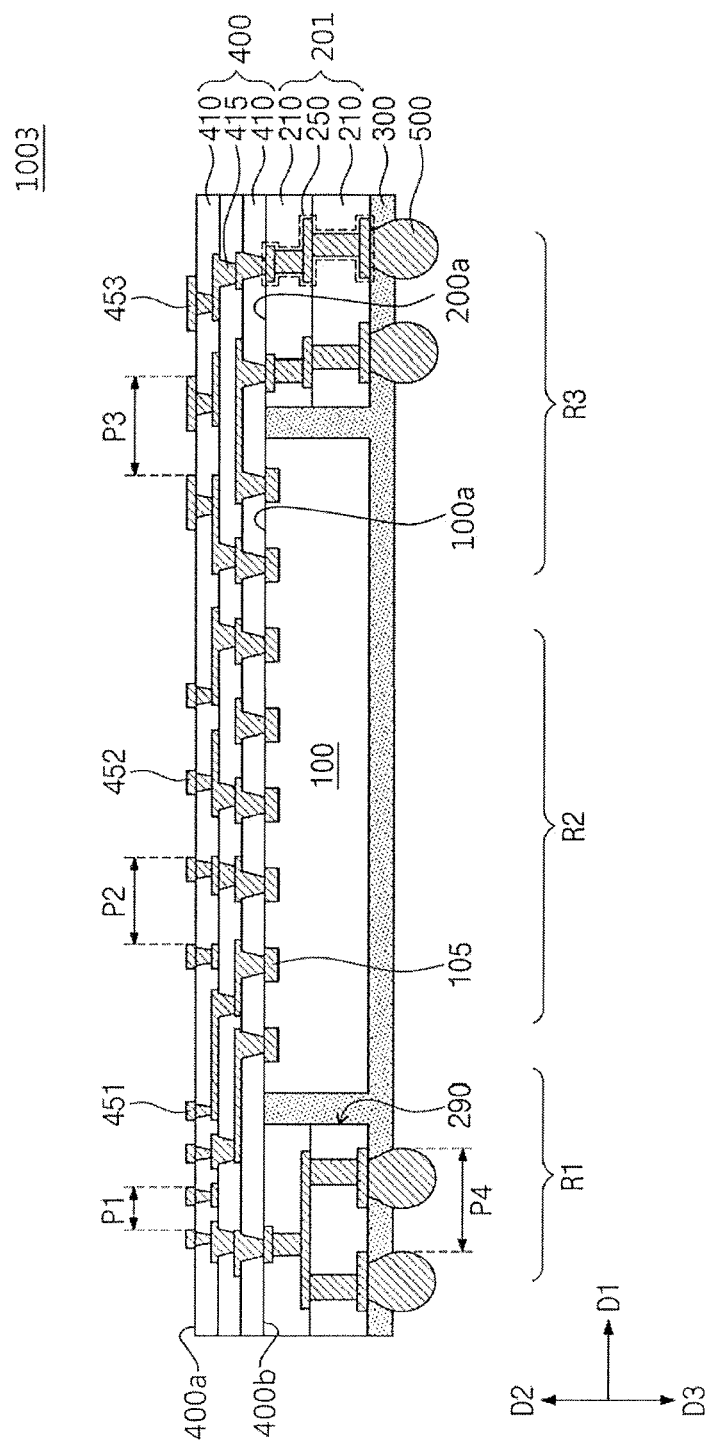
FIG. 7B illustrates a cross-sectional view along line I-II of FIG. 7A or FIG. 1A.

FIG. 7A illustrates a plan view showing a wiring substrate according to exemplary embodiments, which plan view corresponds to that of an interconnect package. FIG. 7B illustrates a cross-sectional view corresponding to that taken along line I-II of FIG. 7A or FIG. 1A. A description duplicate with the aforementioned will be omitted hereinafter.

Referring to FIGS. 1A, 7A, and 7B, an interconnect package 1003 may include a wiring substrate 201, the semiconductor chip 100, the redistribution layer 400, the external connection terminals 500, and the molding pattern 300. As illustrated in FIG. 7A, the wiring substrate 201 may have a tetragonal shape. The wiring substrate 201 may be provided in plural. When viewed in a plan view, the semiconductor chip 100 may be surrounded by the plurality of wiring substrates 201. The semiconductor chip 100 may be spaced apart from the wiring substrates 201. Each of the wiring substrate 201 may include the base layers 210 and the conductive structures 250. The semiconductor chip 100, the redistribution layer 400, the external connection terminals 500, and the molding pattern 300 may be formed as discussed in the example of FIGS. 2A to 2F or FIGS. 5A to 5C.

Alternatively, the lower redistribution layer 700 of FIG. 6 may further be formed on a bottom surface of the molding pattern 300. In this case, the external connection terminals 500 may be disposed on a bottom surface of the lower redistribution layer 700.

FIGS. 8A to 8D illustrate cross-sectional views corresponding to line I-II of FIG. 1A, showing a method of fabricating an interconnect package according to exemplary embodiments. A description duplicate with the aforementioned will be omitted hereinafter. In describing FIGS. 8A to 8D, FIG. 8D is chosen to define a top surface, an upper portion, a bottom surface, and a lower portion.

Figure 8A:
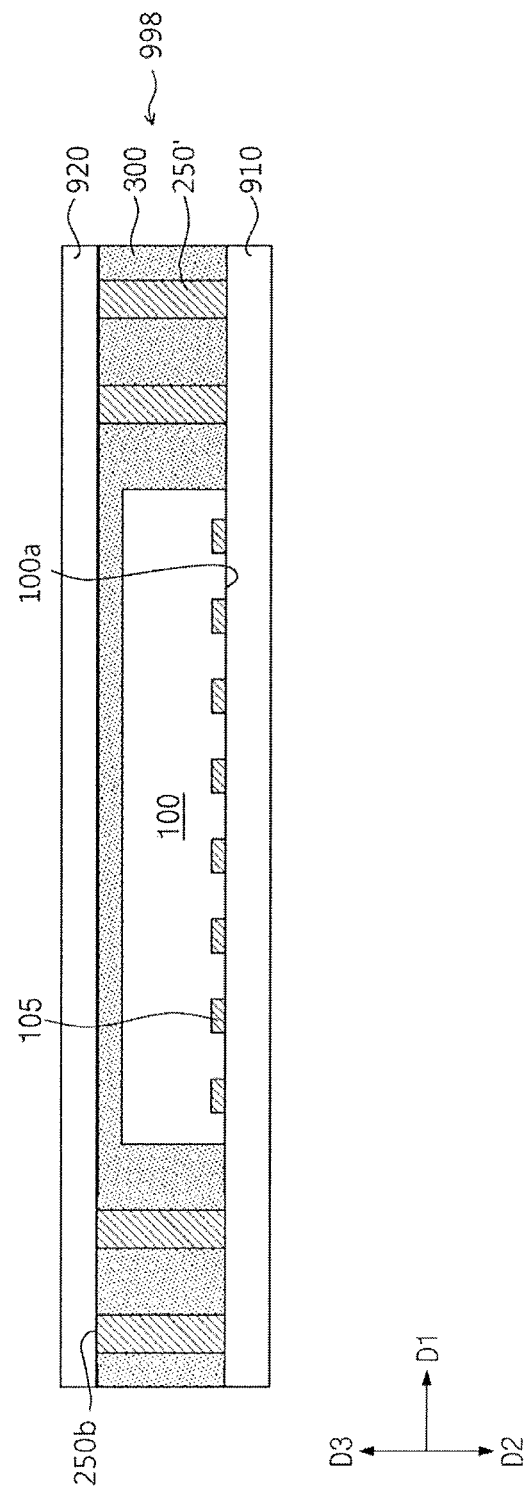
FIGS. 8A to 8D illustrate cross-sectional views of stages in a method of fabricating an interconnect package according to exemplary embodiments.

Referring to FIGS. 1A and 8A, a preliminary package 998 may be formed on the first carrier substrate 910. The preliminary package 998 may include conductive structures 250', the semiconductor chip 100, and the molding pattern 300. The wiring substrate 200 of FIG. 2A may not be provided. Instead of the wiring substrate 200, metal pillars may be provided on the first carrier substrate 910 to form the conductive structures 250'. The conductive structures 250' may include metal pillars.

The molding pattern 300 may be formed on the first carrier substrate 910, covering the semiconductor chip 100. The molding pattern 300 may fill gaps between the conductive structures 250' and between the semiconductor chip 100 and the conductive structures 250'. The molding pattern 300 may expose bottom surfaces 250b of the conductive structures 250'. The second carrier substrate 920 may be provided on the preliminary package 998, covering the molding pattern 300 and the conductive structures 250'.

Figure 8B:
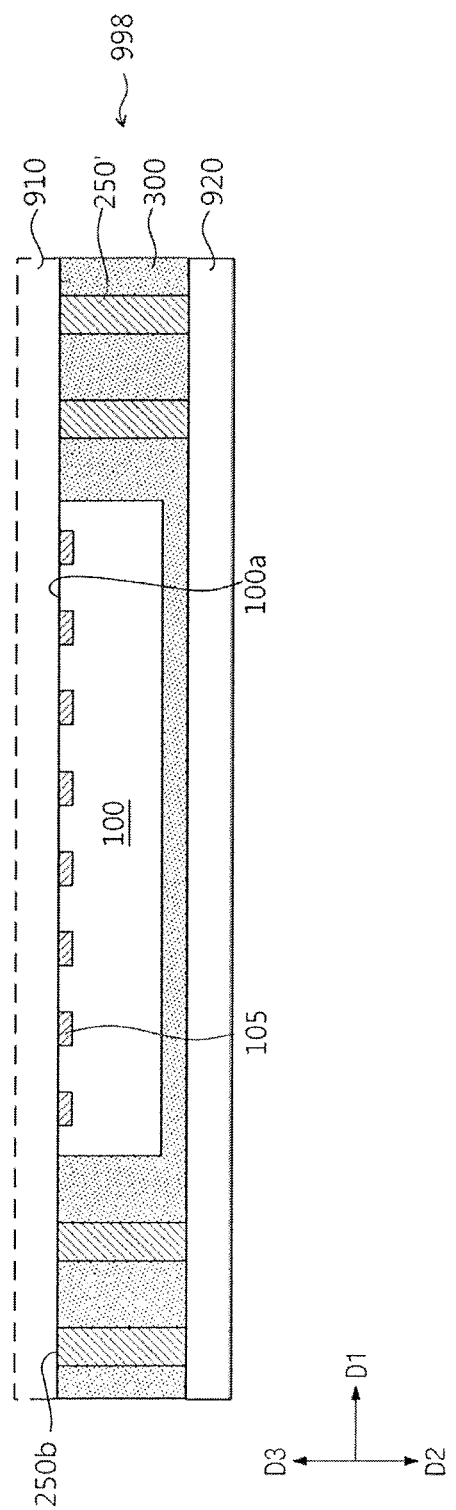

Referring to FIGS. 1A and 8B, the preliminary package 998 and the second carrier substrate 920 may be turned upside down in such a way that the surface 100a of the semiconductor chip 100 may face upward. The first carrier substrate 910 may be removed to expose the surface 100a of the semiconductor chip 100.

Figure 8C:
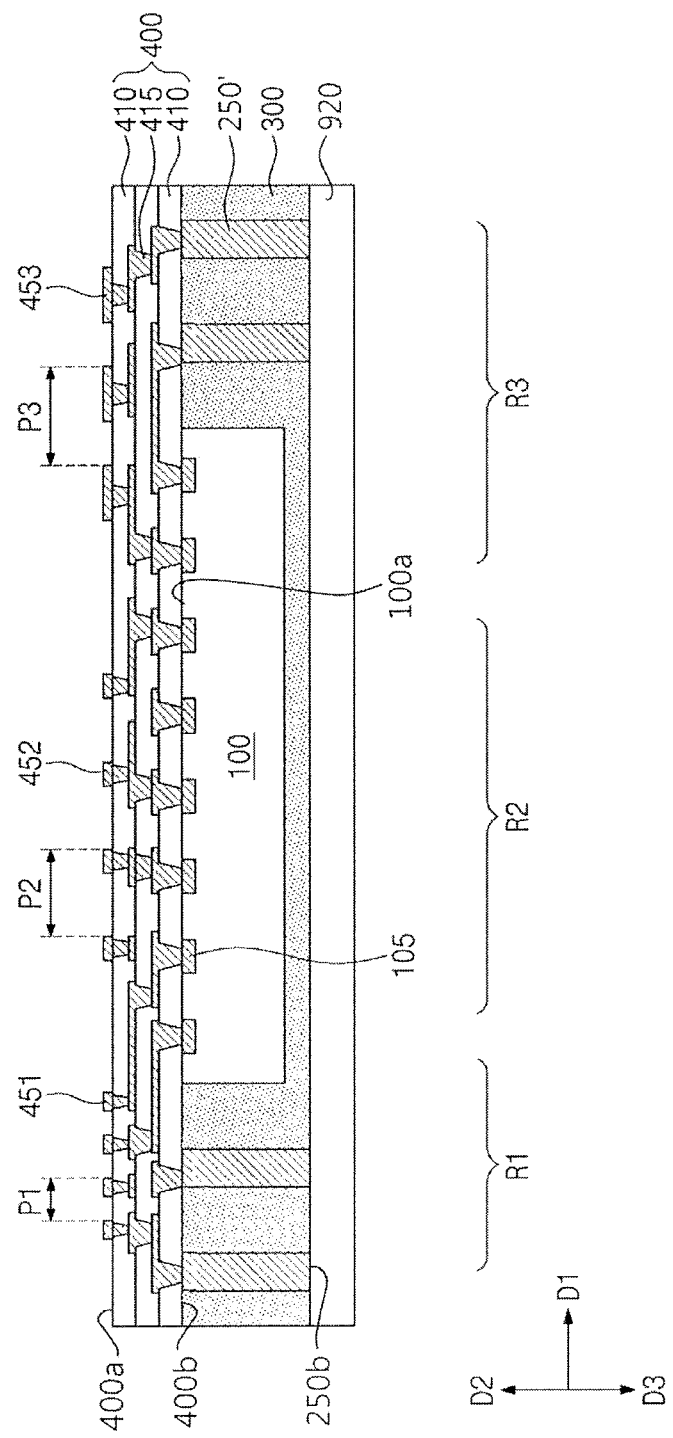

Referring to FIGS. 1A and 8C, the redistribution layer 400 may be formed on an exposed top surface of the preliminary package 998. The redistribution layer 400 may cover the surface 100a of the semiconductor chip 100, the conductive structures 250', and the molding pattern 300. The formation of the redistribution layer 400 may be substantially the same as that discussed with reference to FIG. 2E. The redistribution layer 400 may include insulation patterns 410, redistribution patterns 415, and first to third redistribution pads 451, 452, and 453. The second carrier substrate 920 may be removed to expose the molding pattern 300 and the bottom surfaces 250b of the conductive structures 250'.

Figure 8D:
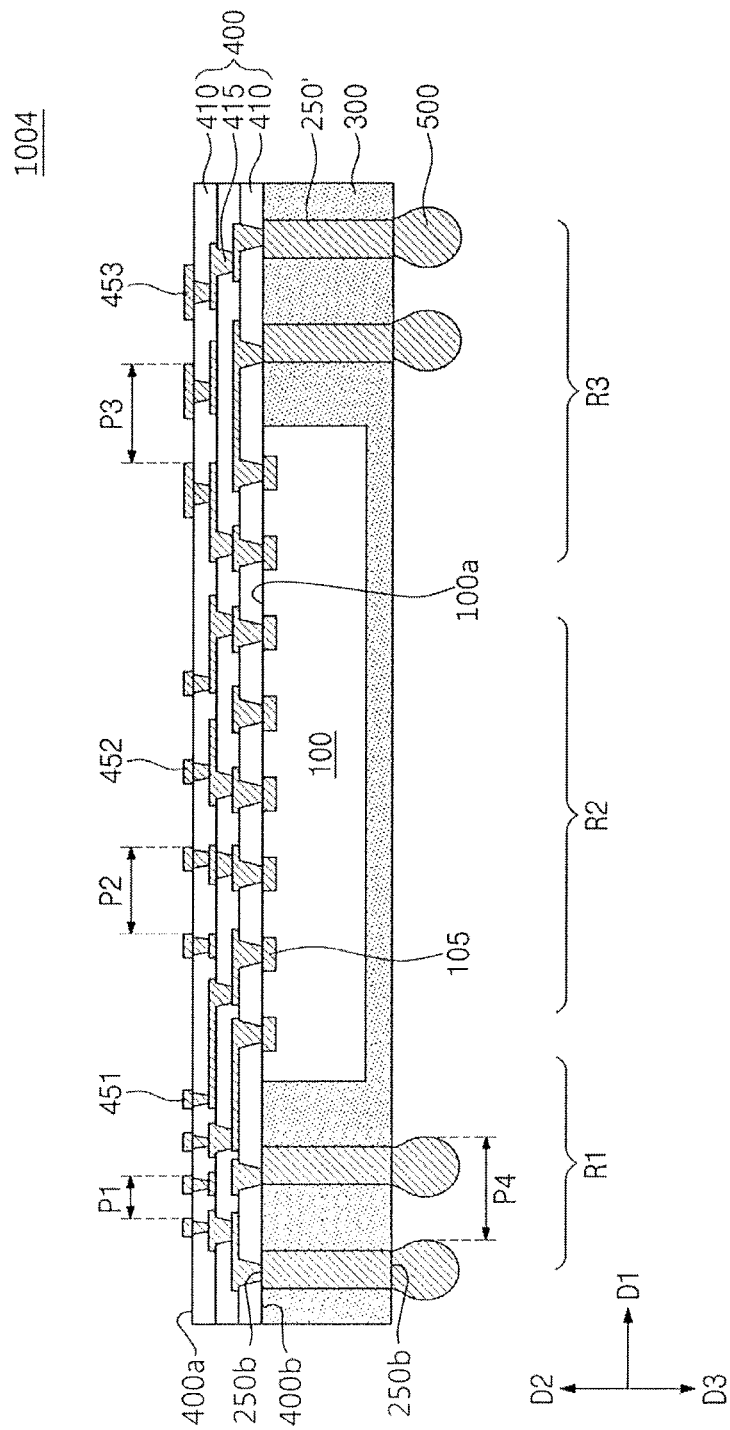

Referring to FIGS. 1A and 8D, the external connection terminals 500 may be formed on a bottom surface of the preliminary package 998, thereby coupling to the conductive structures 250'. For example, the external connection terminals 500 may be formed on the bottom surfaces 250b of the conductive structures 250'. An interconnect package 1004 may therefore be eventually fabricated. The interconnect package 1004 may be fabricated as a fan-out panel level package.

Alternatively, the lower redistribution layer 700 of FIG. 6 may further be formed on a bottom surface of the molding pattern 300. In this case, the external connection terminals 500 may be disposed on a bottom surface of the lower redistribution layer 700. The external connection terminals 500 may have a different pitch or arrangement from that of the conductive structures 250'.

Figure 9A:
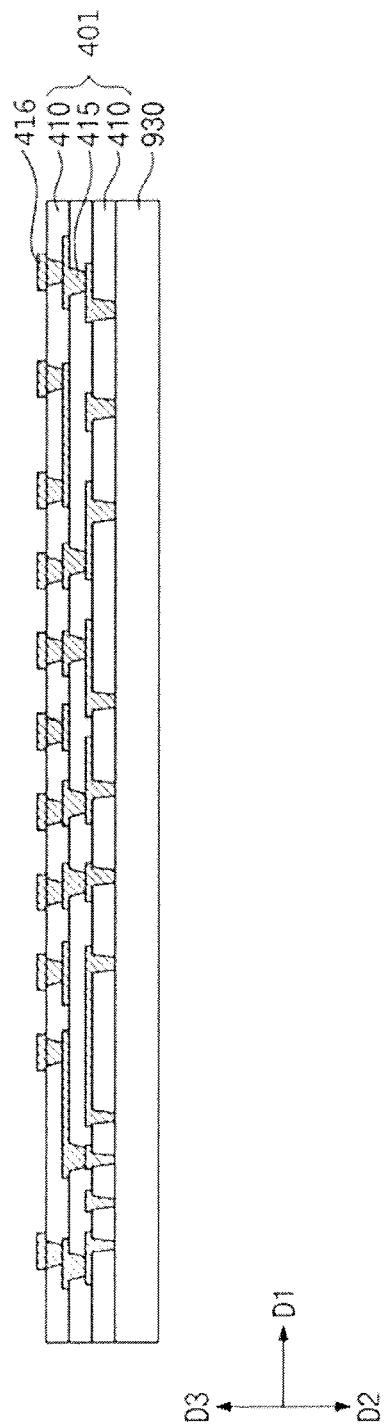
FIGS. 9A to 9C illustrate cross-sectional views of stages in a method of fabricating an interconnect package according to exemplary embodiments.
Figure 9B:
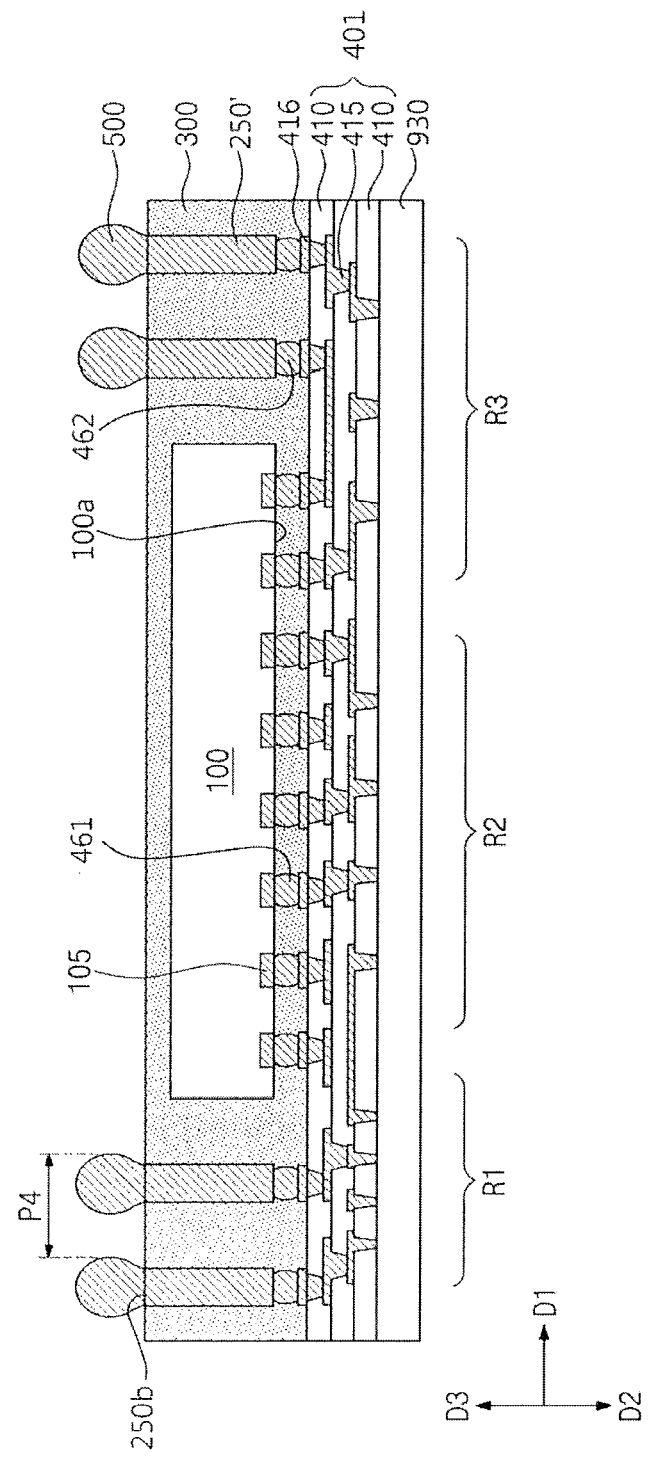
Figure 9C:
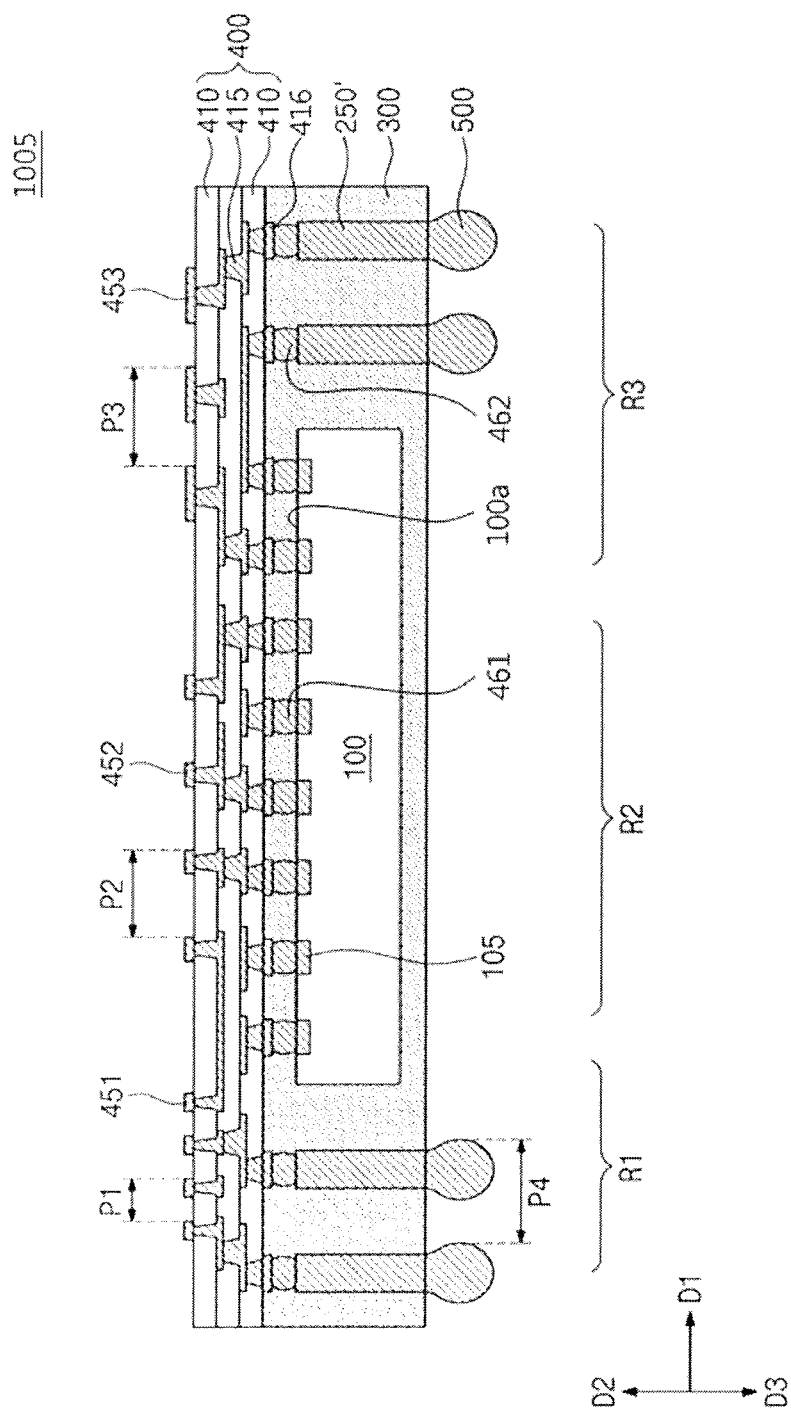

FIGS. 9A to 9C illustrate cross-sectional views corresponding to line I-II of FIG. 1A, showing a method of fabricating an interconnect package according to exemplary embodiments. A description duplicate with the aforementioned will be omitted hereinafter. In describing FIGS. 9A to 9C. FIG. 9C is chosen to define a top surface, an upper portion, a bottom surface, and a lower portion.

Referring to FIGS. 1A and 9A, the insulation patterns 410 and the redistribution patterns 415 may be formed on the third carrier substrate 930, which may form the preliminary redistribution layer 401. The conductive pads 416 may be formed on the preliminary redistribution layer 401. The preliminary redistribution layer 401 may be formed by performing processes substantially the same as those discussed above with reference to FIG. 5A. The conductive pads 416 may be formed on the preliminary redistribution layer 401, thereby coupling to the redistribution patterns 415.

Referring to FIGS. 1A and 9B, the semiconductor chip 100, the conductive structures 250', the molding pattern 300, and the external connection terminals 500 may be formed on the preliminary redistribution layer 401. The semiconductor chip 100 may be placed on the preliminary redistribution layer 401 in such a way that the surface 100a of the semiconductor chip 100 may face the preliminary redistribution layer 401. When viewed in a plan view, the semiconductor chip 100 may be disposed on a central region of the preliminary redistribution layer 401. First conductive interposers 461 may be formed between the semiconductor chip 100 and the preliminary redistribution layer 401, thereby coupling to chip pads 105 of the semiconductor chip 100 and also to the conductive pads 416.

Metal pillars may be disposed on the preliminary redistribution layer 401, which step may form conductive structures 250'. Second conductive interposers 462 may be formed between the conductive structures 250' and the preliminary redistribution layer 401, thereby coupled to the conductive structures 250' and the conductive pads 416.

The molding pattern 300 may be formed on the preliminary redistribution layer 401, covering the semiconductor chip 100. The molding pattern 300 may cover side surfaces of the conductive structures 250' and expose bottom surfaces 250b of the conductive structures 250'. The external connection terminals 500 may be formed on the exposed conductive structures 250', thereby coupled to the conductive structures 250'.

Referring to FIGS. 1A and 9C, the semiconductor chip 100, the molding pattern 300, and the preliminary redistribution layer 401 may be turned upside down in such a way that the surface 100a of the semiconductor chip 100 may face upward. The third carrier substrate 930 may be removed to expose the preliminary redistribution layer 401. First redistribution pads 451, second redistribution pads 452, and third redistribution pads 453 may be formed on the exposed preliminary redistribution layer 401, which step may fabricate a redistribution layer 400. The formation and arrangement of the redistribution pads 451, 452, and 453 may be substantially the same as those discussed above. An interconnect package 1005 may therefore be eventually fabricated.

Alternatively, the lower redistribution layer 700 of FIG. 6 may further be formed on a bottom surface of the molding pattern 300. In this case, the external connection terminals 500 may be disposed on a bottom surface of the lower redistribution layer 700.

Referring back to FIGS. 3A and 3B, the semiconductor package PKG may include the interconnect package 1000, the first semiconductor device 2000, the second semiconductor device 3000, the third semiconductor device 4000, and the molding layer 5000. The interconnect package 1000 may be fabricated as discussed above with reference to FIGS. 2A to 2F. Differently from that shown, the interconnect package 1001 fabricated as discussed in FIGS. 5A to 5C, the interconnect package 1002 of FIG. 6, the interconnect package 1003 of FIGS. 7A and 7B, the interconnect package 1004 fabricated as discussed in FIGS. 8A to 8D, or the interconnect package 1005 of FIGS. 9A to 9C may be used to mount the first to third semiconductor devices 2000, 3000, and 4000 on one of the interconnect packages 1001, 1002, 1003, 1004, and 1005. The semiconductor package PKG may thus be fabricated.

According to embodiments, a semiconductor package having enhanced reliability and durability and a method of fabricating the same may be provided. That is, an interconnect package may include a redistribution layer, a semiconductor chip, a conductive structure, and a molding pattern. The interconnect package may have good compatibility. Although semiconductor devices are different in size, function, pitch of connection pads, and storage capacity, the interconnect package may be coupled to the semiconductor devices. The interconnect package may include the redistribution layer, and the semiconductor devices may be mounted without being limited by width and length of the semiconductor chip. It may be possible to more freely design an electrical path of the semiconductor devices.

The interconnect package may be used to standardize and systematize an electrical connection between the semiconductor devices and the semiconductor chip. A semiconductor package may become compact-sized.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor package, comprising:
a redistribution layer having a first surface and a second surface opposite to each other, the redistribution layer including a plurality of first redistribution pads and a plurality of second redistribution pads on the first surface, the plurality of second redistribution pads having a pitch different from a pitch of the plurality of first redistribution pads;
a semiconductor chip on the second surface of the redistribution layer, an active surface of the semiconductor chip facing the redistribution layer;
a plurality of conductive structures on the second surface of the redistribution layer, the plurality of conductive structures being spaced apart from the semiconductor chip; and
a plurality of external connection terminals on and coupled to the conductive structures, the plurality of external connection terminals having a non-overlapping relationship with respect to the semiconductor chip, in a top view, and the pitch of the plurality of first redistribution pads being smaller than a pitch of the plurality of external connection terminals.

2. The package as claimed in claim 1, wherein the semiconductor chip includes a programmable chip.

3. The package as claimed in claim 1, wherein the plurality of second redistribution pads overlaps a different area of the redistribution layer than the plurality of first redistribution pads, as viewed in the top view.

4. The package as claimed in claim 1, wherein, when viewed in a plan view, at least one of the plurality of first redistribution pads is spaced apart from the semiconductor chip.

5. The package as claimed in claim 1, further comprising a first semiconductor device on the first surface of the redistribution layer, the first semiconductor device being coupled to the plurality of first redistribution pads.

6. The package as claimed in claim 1, wherein at least some of the plurality of first redistribution pads are coupled to the external connection terminals through the redistribution layer and the conductive structures.

7. The package as claimed in claim 1, further comprising a plurality of base layers on the redistribution layer, a hole penetrating the plurality of base layers, and the semiconductor chip being inside the hole.

8. The package as claimed in claim 1, wherein the plurality of external connection terminals is arranged around a perimeter of the semiconductor chip and horizontally spaced apart from the semiconductor chip.

9. The package as claimed in claim 1, wherein the plurality of first redistribution pads and the semiconductor chip have a non-overlapping relationship.

10. The package as claimed in claim 1, wherein the redistribution layer includes:
an insulation pattern; and
a redistribution pattern in the insulation pattern, the plurality of first redistribution pads being coupled to the redistribution pattern.

11. A semiconductor package, comprising:
a redistribution layer having a first surface and a second surface opposite to each other, the redistribution layer including a plurality of first redistribution pads on the first surface;
a plurality of base layers on the second surface of the redistribution layer, a hole penetrating the plurality of base layers;
a semiconductor chip inside the hole on the second surface of the redistribution layer, an active surface of the semiconductor chip facing the redistribution layer;
a plurality of conductive structures on the second surface of the redistribution layer, the plurality of conductive structures being spaced apart from the semiconductor chip;
a plurality of external connection terminals on and coupled to the conductive structures, the plurality of first redistribution pads have a pitch smaller than a pitch of the plurality of external connection terminals,
wherein at least one of the conductive structures includes:
a first pad on an uppermost one of the plurality of base layers;
a conductive pattern between two base layers of the plurality of base layers;
a via penetrating each one of the plurality of base layers, the via being coupled to the conductive pattern; and
a second pad on a lowermost one of the plurality of base layers, the second pad being horizontally offset with respect to the first pad.

12. A semiconductor package, comprising:
a redistribution layer having a first surface and a second surface opposite to each other;
a semiconductor chip on the second surface of the redistribution layer, the semiconductor chip including a chip pad facing the redistribution layer;
a plurality of conductive structures on the second surface of the redistribution layer and spaced apart from the semiconductor chip;
a first semiconductor device including a first semiconductor chip on the first surface of the redistribution layer, the first semiconductor device including Hail at least three connection pads facing the redistribution layer; and
a plurality of first redistribution pads on the first surface of the redistribution layer, the plurality of first redistribution pads being connected to the connection pads, respectively, and the plurality of first redistribution pads having a non-vertically overlapping relationship with the semiconductor chip.

13. The package as claimed in claim 12, further comprising a second semiconductor device on the first surface of the redistribution layer, the second semiconductor device having a height different from a height of the first semiconductor device.

14. The package as claimed in claim 12, wherein, when viewed in a plan view, at least a portion of the first semiconductor device does not overlap the semiconductor chip.

15. The package as claimed in claim 12, wherein the first semiconductor device further includes:
a package substrate,
the first semiconductor chip on the package substrate; and
a molding member on the package substrate and covering the first semiconductor chip.

16. The package as claimed in claim 12, wherein the first semiconductor device and the semiconductor chip are on opposite surfaces of the redistribution layer, the first semiconductor device and the semiconductor chip being connected to each other via the redistribution layer and the plurality of first redistribution pads on the first surface of the redistribution layer, and all the plurality of first redistribution pads being in a region overlapped by the first semiconductor device.

17. The package as claimed in claim 12, further comprising a molding pattern on the second surface of the redistribution layer and covering the semiconductor chip, the molding pattern being between the semiconductor chip and the conductive structures.

18. The package as claimed in claim 17, further comprising:
a lower redistribution layer on a lower surface of the molding pattern, the lower redistribution layer being coupled to the conductive structures; and
a plurality of external connection terminals on a lower surface of the lower redistribution layer, the plurality of external connection terminals being coupled to the lower redistribution layer and to the conductive structures.

* * * * *